United States Patent
Kim et al.

(10) Patent No.: US 8,363,444 B2
(45) Date of Patent: *Jan. 29, 2013

(54) BRIDGE DEVICE ARCHITECTURE FOR CONNECTING DISCRETE MEMORY DEVICES TO A SYSTEM

(75) Inventors: Jin-Ki Kim, Ottawa (CA); HakJune Oh, Ottawa (CA); Hong Beom Pyeon, Ottawa (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/365,895

(22) Filed: Feb. 3, 2012

(65) Prior Publication Data

US 2012/0134194 A1  May 31, 2012

Related U.S. Application Data

(63) Continuation of application No. 12/533,732, filed on Jul. 31, 2009, now Pat. No. 8,134,852, which is a continuation-in-part of application No. 12/401,963, filed on Mar. 11, 2009, now Pat. No. 7,957,173.

(60) Provisional application No. 61/111,013, filed on Nov. 4, 2008, provisional application No. 61/105,061, filed on Oct. 14, 2008, provisional application No. 61/184,955, filed on Jun. 8, 2009.

(51) Int. Cl.
*G11C 7/02* (2006.01)

(52) U.S. Cl. ............................ 365/51; 365/63; 365/191

(58) Field of Classification Search .................... 365/51, 365/191, 63
See application file for complete search history.

(56) References Cited

U.S. PATENT DOCUMENTS

| | | | |
|---|---|---|---|
| 4,174,536 A | 11/1979 | Misunas et al. |
| 4,613,953 A | 9/1986 | Bush |
| 4,899,316 A | 2/1990 | Nagami |
| 5,038,299 A | 8/1991 | Maeda |
| 5,204,669 A | 4/1993 | Dorfe et al. |
| 5,243,703 A | 9/1993 | Farmwald et al. |
| 5,404,460 A | 4/1995 | Thomsen et al. |
| 5,430,859 A | 7/1995 | Norman et al. |
| 5,440,694 A | 8/1995 | Nakajima |
| 5,636,342 A | 6/1997 | Jeffries |
| 5,729,683 A | 3/1998 | Le et al. |

(Continued)

FOREIGN PATENT DOCUMENTS

| | | |
|---|---|---|
| CA | 2310080 | 5/1999 |
| EP | 0910091 | 4/1999 |

(Continued)

OTHER PUBLICATIONS

Ziaie, Kazem, International Patent Application No. PCT/CA2009/001537, Search Report, 2-7, Jan. 12, 2010.

(Continued)

*Primary Examiner* — Pho M Luu
(74) *Attorney, Agent, or Firm* — Shin Hung; Borden Ladner Gervais LLP

(57) ABSTRACT

A bridge device architecture for connecting discrete memory devices. The bridge device is used in conjunction with a composite memory device including at least one discrete memory device. The bridge device includes a local control interface for connecting to the at least one discrete memory device, a local input/output interface for connecting to the at least one discrete memory device, and a global input/output interface. The global input/output interface receives and provides global memory control signals and also receives and provides write data to and read data from the at least one discrete memory device.

19 Claims, 10 Drawing Sheets

U.S. PATENT DOCUMENTS

| | | | |
|---|---|---|---|
| 5,740,379 A | 4/1998 | Hartwig | |
| 5,761,146 A | 6/1998 | Yoo et al. | |
| 5,771,199 A | 6/1998 | Lee | |
| 5,777,488 A | 7/1998 | Dryer et al. | |
| 5,778,419 A | 7/1998 | Hansen et al. | |
| 5,794,000 A | 8/1998 | Furuta | |
| 5,802,399 A | 9/1998 | Yumoto et al. | |
| 5,802,555 A | 9/1998 | Shigeeda | |
| 5,806,070 A | 9/1998 | Norman et al. | |
| 5,828,899 A | 10/1998 | Richard et al. | |
| 5,859,809 A | 1/1999 | Kim | |
| 5,862,154 A | 1/1999 | Pawlowski | |
| 5,900,021 A | 5/1999 | Tiede et al. | |
| 5,937,206 A | 8/1999 | Nakamura | |
| 5,941,941 A | 8/1999 | Hasegawa | |
| 5,941,974 A | 8/1999 | Babin | |
| 5,953,538 A | 9/1999 | Duncan | |
| 5,982,309 A | 11/1999 | Xi et al. | |
| 6,002,638 A | 12/1999 | John | |
| 6,009,479 A | 12/1999 | Jeffries | |
| 6,144,576 A | 11/2000 | Leddige et al. | |
| 6,148,363 A | 11/2000 | Lofgren et al. | |
| 6,212,591 B1 | 4/2001 | Kaplinsky | |
| 6,317,350 B1 | 11/2001 | Pereira et al. | |
| 6,317,352 B1 | 11/2001 | Halbert et al. | |
| 6,317,812 B1 | 11/2001 | Lofgren et al. | |
| 6,453,365 B1 | 9/2002 | Habot | |
| 6,567,904 B1 | 5/2003 | Khandekar et al. | |
| 6,658,509 B1 | 12/2003 | Bonella et al. | |
| 6,658,582 B1 | 12/2003 | Han | |
| 6,665,742 B2 | 12/2003 | Owen et al. | |
| 6,680,904 B1 | 1/2004 | Kaplan et al. | |
| 6,697,906 B1 | 2/2004 | Ayukawa | |
| 6,763,426 B1 | 7/2004 | James et al. | |
| 6,766,411 B2 | 7/2004 | Goldshlag | |
| 6,768,431 B2 | 7/2004 | Chiang | |
| 6,792,003 B1 | 9/2004 | Potluri et al. | |
| 6,807,106 B2 | 10/2004 | Gonzales et al. | |
| 6,919,736 B1 | 7/2005 | Agrawal et al. | |
| 6,928,501 B2 | 8/2005 | Andreas et al. | |
| 6,944,697 B2 | 9/2005 | Andreas | |
| 6,950,325 B1 | 9/2005 | Chen | |
| 6,961,882 B2 | 11/2005 | Manfred et al. | |
| 6,996,644 B2 | 2/2006 | Schoch et al. | |
| 7,031,221 B2 | 4/2006 | Mooney et al. | |
| 7,093,076 B2 | 8/2006 | Kyung | |
| 7,130,955 B2 * | 10/2006 | Azuma | 710/316 |
| 7,130,958 B2 | 10/2006 | Chou et al. | |
| 7,177,170 B2 | 2/2007 | Gomm | |
| 7,254,075 B2 | 8/2007 | Woo et al. | |
| 7,308,524 B2 | 12/2007 | Grundy et al. | |
| 7,471,295 B2 * | 12/2008 | Van Koningsveld | 345/440 |
| 7,599,975 B1 | 10/2009 | Donovan | |
| 7,957,173 B2 * | 6/2011 | Kim | 365/51 |
| 8,060,705 B2 | 11/2011 | Bowyer | |
| 8,108,648 B2 | 1/2012 | Srinivasan et al. | |
| 8,134,852 B2 * | 3/2012 | Kim et al. | 365/51 |
| 2002/0103945 A1 | 8/2002 | Owen | |
| 2002/0114209 A1 | 8/2002 | Koyanagi et al. | |
| 2002/0161941 A1 | 10/2002 | Chue et al. | |
| 2002/0188781 A1 | 12/2002 | Schoch et al. | |
| 2003/0163606 A1 | 8/2003 | Fukaishi et al. | |
| 2004/0001380 A1 | 1/2004 | Beca et al. | |
| 2004/0186948 A1 | 9/2004 | Lofgren et al. | |
| 2004/0186956 A1 | 9/2004 | Perego et al. | |
| 2004/0230738 A1 | 11/2004 | Lim et al. | |
| 2004/0236892 A1 | 11/2004 | Zhu | |
| 2005/0086595 A1 | 4/2005 | Campbell | |
| 2005/0114613 A1 | 5/2005 | Otani et al. | |
| 2005/0160218 A1 | 7/2005 | See et al. | |
| 2005/0213421 A1 | 9/2005 | Polizzi et al. | |
| 2005/0262289 A1 | 11/2005 | Okuda | |
| 2006/0050594 A1 | 3/2006 | Park | |
| 2006/0248305 A1 | 11/2006 | Fang et al. | |
| 2007/0038852 A1 | 2/2007 | Bovino et al. | |
| 2007/0076479 A1 | 4/2007 | Kim et al. | |
| 2007/0076502 A1 | 4/2007 | Pyeon et al. | |
| 2007/0109833 A1 | 5/2007 | Pyeon et al. | |
| 2007/0143677 A1 | 6/2007 | Pyeon et al. | |
| 2007/0153576 A1 | 7/2007 | Oh et al. | |
| 2007/0157000 A1 | 7/2007 | Qawami et al. | |
| 2007/0233903 A1 | 10/2007 | Pyeon | |
| 2007/0234071 A1 | 10/2007 | Pyeon | |
| 2007/0242552 A1 | 10/2007 | Ju | |
| 2007/0263425 A1 | 11/2007 | Ruckerbauer | |
| 2008/0016269 A1 | 1/2008 | Chow et al. | |
| 2008/0019203 A1 | 1/2008 | Ito et al. | |
| 2008/0049505 A1 | 2/2008 | Kim et al. | |
| 2008/0052449 A1 | 2/2008 | Kim et al. | |
| 2008/0080492 A1 | 4/2008 | Pyeon et al. | |
| 2008/0123423 A1 | 5/2008 | Kim | |
| 2008/0155219 A1 | 6/2008 | Pyeon et al. | |
| 2008/0155370 A1 | 6/2008 | Kadomatsu | |
| 2008/0198682 A1 | 8/2008 | Pyeon | |
| 2008/0201548 A1 | 8/2008 | Przybylski et al. | |
| 2008/0205187 A1 | 8/2008 | Pyeon | |
| 2008/0215778 A1 | 9/2008 | Sumi | |
| 2008/0235440 A1 | 9/2008 | Le | |
| 2008/0235443 A1 | 9/2008 | Chow | |
| 2009/0021992 A1 | 1/2009 | Oh | |
| 2009/0039927 A1 | 2/2009 | Gillingham et al. | |
| 2009/0063786 A1 | 3/2009 | Oh | |
| 2009/0103378 A1 | 4/2009 | Schuetz et al. | |
| 2009/0129184 A1 | 5/2009 | Schuetz | |
| 2009/0154285 A1 | 6/2009 | Pyeon | |
| 2009/0154629 A1 | 6/2009 | Pyeon et al. | |
| 2010/0005214 A1 | 1/2010 | Trombley et al. | |
| 2010/0091536 A1 | 4/2010 | Kim | |
| 2010/0091538 A1 | 4/2010 | Kim | |
| 2010/0115172 A1 * | 5/2010 | Gillingham et al. | 710/310 |
| 2010/0115214 A1 | 5/2010 | Pyeon | |

FOREIGN PATENT DOCUMENTS

| | | |
|---|---|---|
| EP | 1587112 | 10/2005 |
| WO | 2006004166 A1 | 1/2006 |
| WO | 2006036811 A2 | 4/2006 |

OTHER PUBLICATIONS

Ziaie, Kazem, "International Patent Application No. PCT/CA2009/001552, Search Report", 1-3, Feb. 3, 2010.

Samsung, "1G×8 Bit/2G×8 Bit NAND Flash Memory", K9F8G08UXM, Technical Specification, Samsung Electronics, Mar. 31, 2007, pp. 1-54.

Lee, S. et al., "A 3.3V 4Gb Four-Level NAND Flash Memory with 90nm CMOS Technology", ISSCC 2004 Session 2 Non-Volatile Memory 2.7, IEEE International Solid-State Circuits Conference, Feb. 15-19, 2004, Digest of Technical Papers, (10 pages), vol. 1, XP010722148, ISBN: 0-7803-8267-6.

PCT/US2008/054307, Partial Search Annex to Form PCT/ISA/206, 5 pages, Sep. 24, 2008.

PCT Patent Application No. PCT/CA2009/001451, Search Report dated Dec. 17, 2009, p. 2.

Shirota, R., et al., "A 2.3um2 Memory Cell Structure for 16Mb NAND EEPROMs", International Electron Devices Meeting 1990, Technical Digest, Dec. 1990, pp. 103-106.

ATMEL, "8-megabit 2.5-volt Only or 2.7-volt Only DataFlash®," Technical Specification, Atmel, Rev. 2225H-DFLSH, Oct. 2004.

"16 Mbit SPI Serial Flash," Preliminary Specification, Silicon Storage Technology Inc., Apr. 2005, 28 pages.

Hara, T. et al., "A 146mm2 8Gb NAND Flash Memory with 70nm Cmos Technology", ISSCC 2005 Session 2 Non Volatile Memory 2.1, IEEE International Solid-State Circuits Conference, Feb. 2005, pp. 44, 45 and 584.

Byeon, D. et al., "An 8Gb Multi-Level NAND Flash Memory with 63nm STI CMOS Process Technology", ISSCC 2005 Session 2 Non-Volatile Memory 2.2, IEEE International Solid-State Circuits Conference, Feb. 2005, pp. 46 and 47.

Tanzawa, T. et al., "Circuit Techniques for a 1.8-V-Only NAND Flash Memory", IEEE Journal of Solid-State Circuits, vol. 37, No. 1, Jan. 2002, pp. 84-89.

Saito S., et al., "A Programmable 80ns 1Mb CMOS EPROM", ISSCC Digest of Technical Papers, IEEE International Solid-State Circuits Conference, ISSCC Digest of Technical Papers, Feb. 14, 1985, pp. 176-177, 340.

Momodomi, M. et al., "A 4-Mb NAND EEPROM with Tight Programmed Vt Distribution", IEEE Journal of Solid-State Circuits, vol. 26, Issue 4, Apr. 1991, pp. 492-496.

Ohtsuka, N. et al., "A 4-Mbit CMOS EPROM", IEEE Journal of Solid-State Circuits, vol. 22, Issue 5, Oct. 1987, pp. 669-675.

Kim, et al. "A 120-mm2 64-Mb NAND Flash Memory Achieving 180 ns/Byte Effective Program Speed," IEEE Journal of Solid-State Circuits, vol. 32, No. 5, May 1997, pp. 670-680.

Suh, K. et al., "A 3.3 V 32 Mb NAND Flash Memory with Incremental Step Pulse Programming Scheme", IEEE Journal of Solid-State Circuits, vol. 30, No. 11, Nov. 1995, pp. 1149-1156.

Takeuchi, K. et al., "A Multipage Cell Architecture for High-Speed Programming Multilevel NAND Flash Memories", IEEE Journal of Solid-State Circuits, vol. 33, Issue 8, Aug. 1998, pp. 1228-1238.

Tanzawa T., et al., "A dynamic analysis of the Dickson charge pump circuit;" IEEE Journal of Solid-State Circuits, vol. 32, No. 8, Aug. 1997, pp. 1231-1240.

Tanaka, T. et al., "A Quick Intelligent Page-Programming Architecture and a Shielded Bitline Sensing Method for 3 V-Only NAND Flash Memory", IEEE Journal of Solid-State Circuits, vol. 29, Issue 11, Nov. 1994, pp. 1366-1373.

Imamiya, K. et al., "A 125-mm2 1-Gb NAND Flash Memory with 10-MByte/s Program Speed", IEEE Journal of Solid-State Circuits, vol. 37, No. 11, Nov. 2002, pp. 1493-1501.

Lee, J. J et al., "High-Performance 1-Gb NAND Flash Memory with 0.12-µm Technology", IEEE Journal of Solid-State Circuits, vol. 37, No. 11, Nov. 2002, pp. 1502-1509.

Jung, T. et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.

Tomita, N. et al., "A 62-ns 16-Mb CMOS EPROMm with Voltage Stress Relaxation Technique" IEEE Journal of Solid-State Circuits, vol. 26, No. 11, Nov. 1991, pp. 1593-1599.

Cho, T. et al., "A Dual Mode NAND Flash Memory: 1-Gb Multilevel and High-Performance 512-Mb Single-Level Modes", IEEE Journal of Solid-State Circuits, vol. 36, No. 11, Nov. 2001, pp. 1700-1706.

Kirisawa, R. et al., "A NAND Structured Cell with a new Programming Technology for Highly Reliable 5V-Only Flash EEPROM", 1990 Symposium on VLSI Technology, Jun. 4, 1990, CH 2874-6, 90/0000-0129 1990 IEEE, Honolulu, US pp. 129-130.

Aritome, S. et al., "A Reliable Bi-Polarity Write/Erase Technology in Flash EEPROMS", International Electron Devices Meeting, 1990, Technical Digest, Dec. 9-12, 1990, pp. 111-114.

Hara, T. et al., "A 146-mm2 8-Gb Multi-Level NAND Flash Memory With 70-nm CMOS Technology", IEEE Journal of Solid State Circuits, Jan. 2006, vol. 41, No. 1, pp. 161-169.

Takeuchi, K. et al, "A 56nm Cmos 99mm2 8Gb Multi-level NAND Flash Memory with 10MB/s Program Throughput", Solid-State Circuits, 2006 IEEE International Conference Digest of Technical Papers, Session 7, Feb. 6-9, 2006, pp. 144,145,645, ISBN: 1-4244-0079-1.

Samsung Electronics Co. Ltd, "256M×8 Bit / 128 M×16 Bit / 512M×8 Bit NAND Flash Memory", K9K4G08U1M, May 6, 2005, pp. 1-41.

Samsung Electronics Co. Ltd, "512M×8 Bit / 1G×8 Bit Nand Flash Memory", K9XXG08UXA, May 7, 2006, pp. 1-43.

Samsung Electronics Co. Ltd, "1G×8 Bit / 2G×8 Bit / 4G×8 Bit Nand Flash Memory", K9XXG08UXA, Jul. 18, 2006, pp. 1-50.

Choi, Young, "16-Gbit MLC NAND Flash Weighs In", EETimes.com, Jul. 30, 2007, pp. 1-3, http://www.eetimes.com/showArticle.jhtmlarticleID=201200825.

Gal, et al., "Algorithms and Data Structures for Flash Memories", ACM Computing Surveys (CSUR), vol. 37, No. 2, p. 138-163, Jun. 2005, Tel Aviv University.

Lee J. et al., "A 90-nm CMOS 1.8-V 2-Gb NAND Flash Memory for Mass Storage Applications", IEEE Journal of Solid-State Circuits, vol. 38, No. 11, Nov. 2003. pp. 1934-1942.

Samsung Electronics Co. Ltd, "2G×8 Bit Nand Flash Memory", K9XXG08UXM, Sep. 21, 2006, pp. 1-48.

Toshiba, "16 Gbit (2G×8 Bit) CMOS NAND E2PROM (Multi-Level-Cell)", TC58NVG4D1DTG00, Nov. 9, 2006.

Toshiba, "2GBIT (256M×8 Bits) CMOS NAND E2PROM", TH58NVG1S3AFT05, May 19, 2003, pp. 1-32.

"HyperTransport TM I/O Link Specification", Revision 3.00a, Document No. HTC20051222-0046-0017, 2001-2006, Hypertransport Technology Consortium, Nov. 22, 2006, pp. 1-443.

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., Mar. 1996, pp. i-91.

Oshima, et al., "High-Speed Memory Architectures for Multimedia Applications", Circuits & Devices, IEEE 8755-3996/97, Jan. 1997, pp. 8-13.

Gjessing, S., et al., "RamLink: A High-Bandwidth Point-to-Point Memory Architecture", Proceedings CompCom 1992, IEEE 0-8186-2655-0/92, Feb. 24-28, 1992, pp. 328-331.

Gjessing, S., et al., "Performance of the RamLink Memory Architecture", Proceedings of the Twenty-Seventh Annual Hawaii International Conference on System Sciences, IEEE 1060-3425/94, Jan. 1994, pp. 154-162.

Gjessing, S., et al., "A RAM Link for High Speed", Special Report/Memory, IEEE Spectrum, Oct. 1992, pp. 52-53.

Diamond, S.L., "SyncLink: High-speed DRAM for the Future", Micro Standards, IEEE Micro, pp. 74-75, Dec. 1996.

"The I2C-Bus Specification," Version 2.1, Philips Semiconductors, Jan. 2000, pp. 1-46 pages.

Schuetz, et al., "HyperLink NAND Flash Architecture for Mass Storage Applications," IEEE NVSMW, Aug. 2007, pp. 3-4.

Gillingham, "HLNAND: A New Standard for High Performance Flash Memory", Flash Memory Summit, Santa Clara, California, Aug. 2008, pp. 1-18.

* cited by examiner

BRIDGE DEVICE ARCHITECTURE FOR CONNECTING DISCRETE MEMORY DEVICES TO A SYSTEM

CROSS REFERENCE TO RELATED APPLICATIONS

This application is a continuation of U.S. application Ser. No. 12/533,732 filed on Jul. 31, 2009, now issued as U.S. Pat. No. 8,134,852, which is a continuation-in-part of U.S. application Ser. No. 12/401,963 filed on Mar. 11, 2009 entitled "A COMPOSITE MEMORY HAVING A BRIDGING DEVICE FOR CONNECTING DISCRETE MEMORY DEVICES TO A SYSTEM", now issued as U.S. Pat. No. 7,957,173 and which claims the benefit of: U.S. Provisional Application Ser. No. 61/111,013 titled "SYSTEM HAVING ONE OR MORE NONVOLATILE MEMORY DEVICES," filed Nov. 4, 2008; and U.S. Provisional Application Ser. No. 61/105,061 titled "SYSTEM HAVING ONE OR MORE NONVOLATILE MEMORY DEVICES," filed Oct. 14, 2008, and all of the above-mentioned applications are hereby incorporated by reference.

U.S. application Ser. No. 12/533,732, filed on Jul. 31, 2009, now issued as U.S. Pat. No. 8,134,852 also claims the benefit of: U.S. Provisional Application Ser. No. 61/184,955 filed Jun. 8, 2009, which is hereby incorporated by reference.

BACKGROUND

Semiconductor memory devices are important components in presently available industrial and consumer electronics products. For example, computers, mobile phones, and other portable electronics all rely on some form of memory for storing data. Many memory devices are available as commodity, or discrete memory devices, the need for higher levels of integration and higher input/output (I/O) bandwidth has led to the development of embedded memory, which can be integrated with systems, such as microcontrollers and other processing circuits.

Most consumer electronics employ, non-volatile devices, such as flash memory devices, for storage of data. Demand for flash memory devices has continued to grow significantly because these devices are well suited in various applications that require large amounts of non-volatile storage, while occupying a small physical area. For example, flash is widely found in various consumer devices, such as digital cameras, cell phones, universal serial bus (USB) flash drives and portable music players, to store data used by these devices. Also, flash devices are used as solid state drives (SSDs) for hard disk drive (HDD) replacement. Such portable devices are preferably minimized in form factor size and weight. Unfortunately, multimedia and SSD applications require large amounts of memory which can increase the form factor size and weight of their products. Therefore, consumer product manufacturers compromise by limiting the amount of physical memory included in the product to keep its size and weight acceptable to consumers. Furthermore, while flash memory may have a higher density per unit area than DRAM or SRAM, its performance is typically limited due to its relatively low I/O bandwidth that negatively impacts its read and write throughput.

In order to meet the ever-increasing demand for and ubiquitous nature of applications of memory devices, it is desirable to have high-performance memory devices, i.e., devices having higher I/O bandwidth, higher read & write throughput, and increased flexibility of operations.

SUMMARY

Bridge device architecture for connecting discrete memory devices is disclosed. The devices are, for example, memory devices, such as flash memories, dynamic random access memories (DRAMs), and static random access memories (SRAMs), DiNOR Flash EEPROM device(s), Serial Flash EEPROM device(s), Ferro RAM device(s), Magneto RAM device(s), Phase Change RAM device(s), or any suitable combination of these and/or other devices.

In an aspect, there is provided a bridge device to access a discrete memory device. The bridge device comprises a first local interface, a second local interface and a global input/output interface interposed between the first local interface and the second local interface. The first local interface communicates a first portion of local signals between the bridge device and the discrete memory device. The second local interface communicates a second portion of local signals between the bridge device and the discrete memory device. The global input/output interface communicates global signals to and from the bridge device.

In an embodiment, the bridge device further comprises a format converter for converting the global signals having a global format to the first portion of local signals and the second portion of local signals. The first portion of local signals and the second portion of local signals have a local format. The format converter may include bridge device control logic for processing the global signals to provide global memory control signals and global memory input/output data. The global memory input/output data may include one of a command, read data or write data.

In an embodiment, the format converter includes a local control signal generator, a local command generator, and a data format converter. The local control signal generator generates, from the global memory control signals, local control signals in the local format for controlling the discrete memory devices. The local command generator generates, from the global input/output data, local command signals in the local format for execution by the discrete memory devices. The data format converter converts write data having the global format into write data having the local format and read data having the local format to read data having the global format.

In another embodiment, the data format converter includes at least one memory bank to store write data having the local format prior to being transferred to the discrete memory device. The at least one memory banks also stores read data having the local format read from the discrete memory device prior to being converted to read data having the global format. The data format converter may include global data path logic for controlling a data transfer rate of the write data having the global format between the global input/output interface and the at least one memory bank, and for controlling a data transfer rate of the read data having the local format between the at least one memory bank and the global input/output interface. In addition, the data format converter may include local data path logic for controlling a data transfer rate of the write data having the local format and the read data having the local format between the bridge device and the discrete memory device. Furthermore, the data format converter may include an N-bit data channel enabling bi-directional data transfer between the at least one memory bank and the discrete memory device and between the at least one memory bank and the global input/output interface.

In another embodiment, the first local interface is a local control interface providing local control signals to the discrete memory device. The second local interface is a local input/output interface communicating local input/output data between the bridge device and the discrete memory device. The local input/output data includes one of a command, read data or write data.

In another embodiment, the first local interface and the second local interface operate at a first voltage range and the global input/output interface operates at a second voltage range. The first voltage range may be higher than the second voltage range.

In another aspect, there is provided a composite memory device comprising at least one discrete memory device and a bridge device. The discrete memory device executes memory operations in response to local memory control signals having a local format. The bridge device comprises a first local interface communicating a first portion of local signals between the bridge device and the at least one discrete memory device, a second local interface communicating a second portion of local signals between the bridge device and the at least one discrete memory device, and a global input/output interface interposed between the first local interface and the second local interface. The global input/output interface communicates global signals to and from the bridge device.

In an embodiment, the at least one discrete memory device and the bridge device are encapsulated in a package. The global input/output port can be electrically coupled to leads of the package. Electrical conductors can be used to couple the local input/output interface to the at least one discrete memory device. The electrical conductors can couple the local input/output interface to the at least one discrete memory device via a substrate of the package. Alternatively, the local input/output interface can be wirelessly coupled to the at least one discrete memory device. The at least one discrete memory device can be a packaged memory device and the bridge device can be a packaged bridge device. The packaged memory device and the packaged bridge device can be mounted onto a printed circuit board (PCB).

In an embodiment, the local input/output interface and the global input/output interface are electrically coupled to leads of the packaged bridge device. The packaged memory device can have memory leads electrically connected to the local input/output interface of the packaged bridge device. The connection pads of the packed memory device and the packed bridge device can be aligned along the same side with respect to each other. Alternatively, the connection pads of the packed memory device and the packed bridge device are aligned along orthogonal sides with respect to each other.

In another aspect, there is provided a memory system comprising a memory controller and N composite memory devices. The memory controller provides a global command corresponding to a memory operation. The N composite memory devices are connected serially with each other and the memory controller in a ring topology configuration. Each of the N composite memory devices has M discrete memory devices and a bridge device. Each bridge device comprises a first local interface communicating a first portion of local signals between the bridge device and at least one of the M discrete memory devices, a second local interface communicating a second portion of local signals between the bridge device and the at least one of the M discrete memory devices, and a global input/output interface interposed between the first local interface and the second local interface. The global input/output interface communicates global signals to and from the bridge device. N and M are integer values greater than 0.

In an embodiment, the N composite memory devices is a system in package (SIP). Each of the N composite memory devices can be a PCB and the M discrete memory devices and the bridge device can be packaged devices having package leads connected to conductive tracks in the PCB.

BRIEF DESCRIPTION OF THE DRAWINGS

Reference will now be made, by way of example, to the accompanying drawings.

DETAILED DESCRIPTION

Figure 1A:
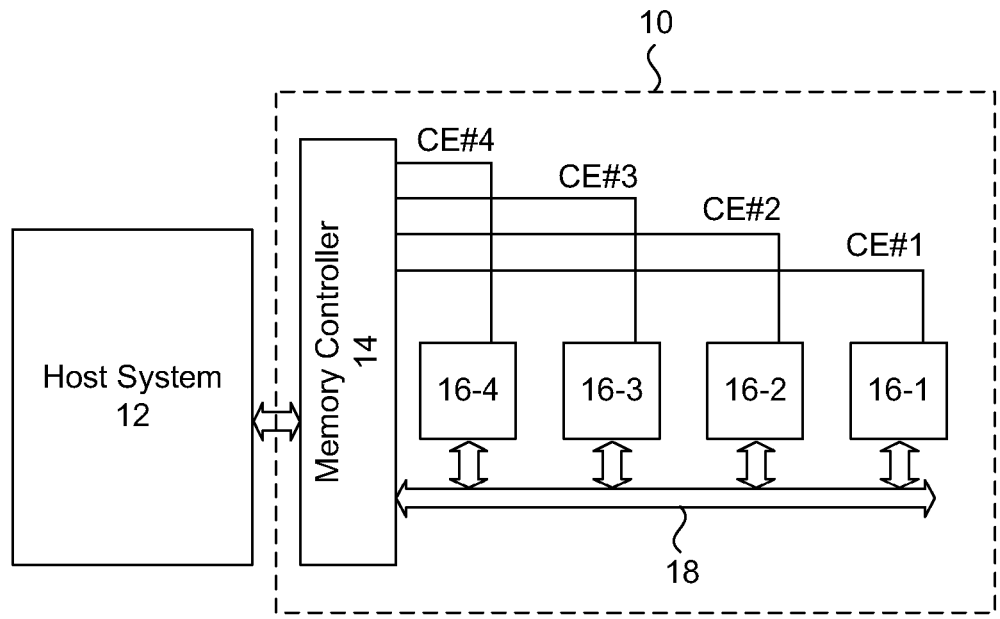
FIG. 1A is a block diagram of an example non-volatile memory system.

Generally, at least some embodiments are directed to a composite memory device including at least one discrete memory device and a bridge device for controlling the discrete memory devices in response to global memory control signals having a format or protocol that is incompatible with the discrete memory devices. The discrete memory devices can be commercial off-the-shelf semiconductor memory devices or custom memory devices, which respond to native, or local memory control signals. The global and local memory control signals include commands and command signals each having different formats.

In accordance with an aspect, the bridge device, or chip, comprises a first local interface, a second local interface and a global input/output interface interposed between the first local interface and the second local interface. The first local interface communicates a first portion of local signals between the bridge device and the discrete memory device. The second local interface communicates a second portion of local signals between the bridge device and the discrete memory device. The global input/output interface communicates global signals to and from the bridge device.

While it is understood that the first local interface and the second local interface communicate a first portion and a second portion, respectively, of local signals between the bridge device and the discrete memory device, the following description makes reference to an example embodiment wherein the first local interface is a local control interface providing local control signals to the discrete memory device and the second local interface is a local input/output interface communicating local input/output data between the bridge device and the discrete memory device. This is done solely for the purposes of ease of understanding and is considered to be illustrative and not restrictive.

The global input/output interface of the bridge device, also referred to herein as the bridge device input/output interface, communicates with a memory controller or another composite memory device in a global format. For example, the global input/output interface receives and provides global memory control signals as well as write data to and read data from the at least one discrete memory device of the composite memory device.

The local control interface and the local input/output interface are collectively referred to herein as the bridge chip memory device interface. The global input/output interface, the local control interface, and the local input/output interface have ports for receiving and providing signals.

The global memory control signals received at the global input/output interface of the bridge device is provided to the local control interface via a command converter to convert the global memory control signals from the global format to a local format compatible with discrete memory devices connected to it. Write data in a global format received at the global input/output interface of the bridge device is provided to the local input/output interface via a data format converter to convert the data in the global format to the local format prior to being transmitted to the discrete memory devices. Conversely, read data in the local format from the discrete memory device is converted to the global format and read out through the global input/output interface of the bridge device.

The command format converter and the data format converter are collectively referred to herein as format converter. The global format is followed only by the global memory control signals received by the bridge devices, while the local format is followed only by the local memory control signals used by the discrete memory devices. Thus, the bridge chip memory device interface communicates with each discrete memory device connected to the bridge device in the local format.

The system and device in accordance with the techniques described herein are applicable to a memory system having a plurality of devices connected in series. The devices are, for example, semiconductor memory devices, such as dynamic random access memories (DRAMs), static random access memories (SRAMs), flash memories, DiNOR Flash EEPROM memories, Serial Flash EEPROM memories, Ferro RAM memories, Magneto RAM memories, Phase Change RAM memories, and any other suitable type of memory.

Following are descriptions of two different memory devices and systems to facilitate a better understanding of the later described composite memory device and bridge device embodiments.

FIG. 1A is a block diagram of a non-volatile memory system 10 integrated with a host system 12. The system 10 includes a memory controller 14 in communication with host system 12, and a plurality of non-volatile memory devices 16-1, 16-2, 16-3 and 16-4. For example the non-volatile memory devices 16-1-16-4 can be discrete asynchronous flash memory devices. The host system 12 includes a processing device such as a microcontroller, microprocessor, or a computer system. The system 10 of FIG. 1A is organized to include one channel 18, with the memory devices 16-1-16-4 being connected in parallel to channel 18. Those skilled in the art should understand that the system 10 can have more or fewer than four memory devices connected to it. In the presently shown example, the memory devices 16-1-16-4 are asynchronous and connected in parallel with each other.

Channel 18 includes a set of common buses, which include data and control lines that are connected to all of its corresponding memory devices. Each memory device is enabled or disabled with respective chip select (enable) signals CE1#, CE2#, CE3# and CE4#, provided by memory controller 14. In this and following examples, the "#" indicates that the signal is an active low logic level signal. In this scheme, one of the chip select signals is typically selected at one time to enable a corresponding one of the non-volatile memory devices 16-1-16-4. The memory controller 14 is responsible for issuing commands and data, via the channel 18, to a selected memory device in response to the operation of the host system 12. Read data output from the memory devices is transferred via the channel 18 back to the memory controller 14 and host system 12. The system 10 is generally said to include a multi-drop bus, in which the memory devices 16-1-16-4 are connected in parallel with respect to channel 18.

Figure 1B:
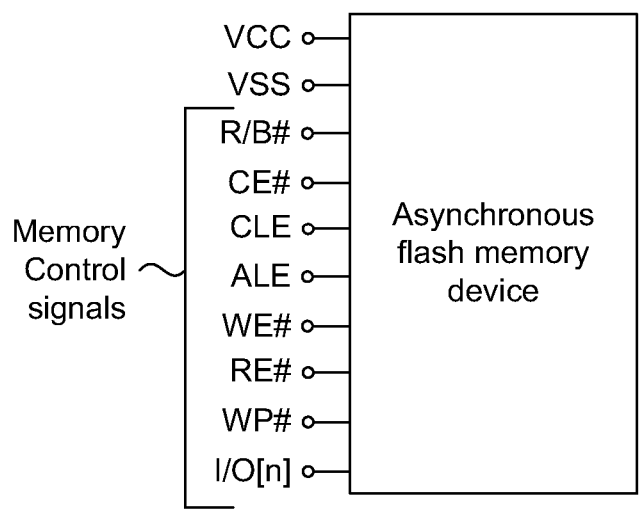
FIG. 1B is a diagram of a discrete flash memory device used in the example memory system of FIG. 1A.

FIG. 1B is a diagram of one of the discrete flash memory devices 16-1-16-4 which can be used in the memory system of FIG. 1A. This flash memory device includes several input and output ports, which include for example power supply, control ports and data ports. The term "ports" refers to a generic input or output terminals into the memory device, which includes package pins, package solder bumps, chip bond pads, and wireless transmitters and receivers for example. The power supply ports include VCC and VSS for supplying power to all the circuits of the flash memory device. Additional power supply ports can be provided for supplying only the input and output buffers, as is well known in the art. Table 1 below provides an example listing of the control and data ports, their corresponding descriptions, definitions, and example logic states. It should be noted that different memory devices may have differently named control and data ports which may be functionally equivalent to those shown in Table 1, but follow protocols specific to that type of memory device. Such protocols may be governed by an established standard, or customized for a particular application. It is noted that that package pins and ball grid arrays are physical examples of a port, which is used for interconnecting signals or voltages of a packaged device to a board. The ports can include other types of connections, such as for example, terminals and contacts for embedded and system-in-package (SIP) systems.

TABLE 1

| Port | Description |
|---|---|
| R/B# | Ready/Busy: the R/B# is open drain port and the output signal is used to indicate the operating condition of the device. The R/B# signal is in Busy state (R/B# = LOW) during the Program, Erase and Read operations and will return to Ready state (R/B# = HIGH) after completion of the operation. |
| CE# | Chip Enable: the device goes into a low-power Standby mode when CE# goes HIGH during the device is in Ready state. The CE# signal is ignored when device is in Busy state (R/B# = LOW), such as during a Program or Erase or Read operation, and will not enter Standby mode even if the CE# input goes HIGH |
| CLE | Command Latch Enable: the CLE input signal is used to control loading of the operation mode command into the internal command register. The command is latched into the command register from the I/O port on the rising edge of the WE# signal while CLE is HIGH. |
| ALE | Address Latch Enable (ALE): the ALE signal is used to control loading address information into the internal address register. Address information is latched into the address register from the I/O port on the rising edge of the WE# signal while ALE is HIGH. |
| WE# | Write Enable: the WE# signal is used to control the acquisition of data from the I/O port. |
| RE# | Read Enable: the RE signal controls serial data output. Data is available after the falling edge of RE#. |
| WP# | Write Protect: the WP# signal is used to protect the device from accidental programming or erasing. The internal voltage regulator (high voltage generator) is reset when WP# is LOW. This signal is usually used for protecting the data during the power-on/off sequence when input signals are invalid. |
| I/O[n] | I/O Port: are used as a port for transferring address, command and input/output data to and from the device. Variable n can be any non-zero integer value. |

All the signals noted in Table 1 are generally referred to as the memory control signals for operation of the example flash memory device illustrated in FIG. 1B. It is noted that the last port I/O[n] is considered a memory control signal as it can receive commands which instruct the flash memory device to execute specific operations. Because a command asserted on port I/O[n] is a combination of logic states applied to each individual line making up I/O[n], the logic state of each signal of I/O[n] functions in the same manner as one of the other memory control signals, such as WP# for example. The main difference being that it is a specific combination of I/O[n] logic states controls the flash memory device to perform a function. The commands are received via its I/O ports and the command signals include the remaining control ports. Those skilled in the art understand that operational codes (op codes) are provided in the command for executing specific memory operations. With the exception of the chip enable CE#, all the other ports are coupled to respective global lines that make up channel 18. Individual chip enable signals are provided to each flash memory device by the memory controller 14. All the ports are controlled in a predetermined manner for executing memory operations. This includes signal timing and sequencing of specific control signals while address, command and I/O data is provided on the I/O ports. Therefore, the memory control signals for controlling the asynchronous flash memory device of FIG. 1B has a specific format, or protocol.

Each of the non-volatile memory devices of FIG. 1A has one specific data interface for receiving and providing data. In the example of FIG. 1A, this is a parallel data interface used in asynchronous flash memory devices, as well as in some synchronous flash memory devices, for example, ONFi 2.0 devices. Standard parallel data interfaces providing multiple bits of data in parallel are known to suffer from well known communication degrading effects such as cross-talk, signal skew and signal attenuation, for example, which degrades signal quality, when operated beyond their rated operating frequency.

In order to increase data throughput, a memory device having a serial data interface has been disclosed in commonly owned U.S. Patent Publication No. 20070153576 entitled "Memory with Output Control", and commonly owned U.S. Patent Publication No. 20070076502 entitled "Daisy Chain Cascading Devices" which receives and provides data serially at a frequency, for example, 200 MHz. This is referred to as a serial data interface format. As shown in these commonly owned patent publications, the described memory device can be used in a system of memory devices that are serially connected to each other.

Figure 2A:
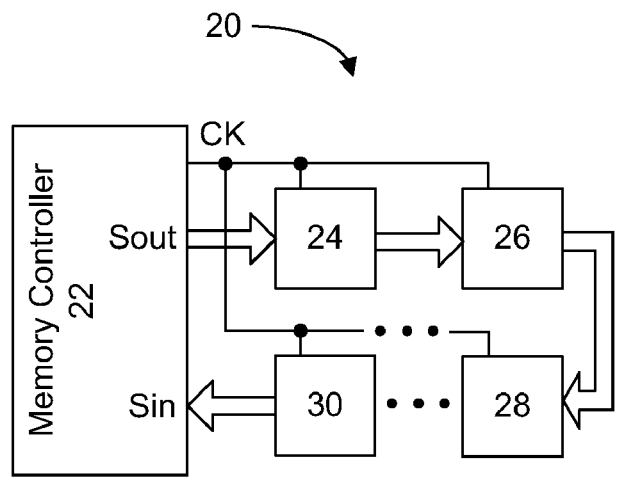
FIG. 2A is a block diagram of an example serial memory system.

FIG. 2A is a block diagram illustrating the conceptual nature of a serial memory system. In FIG. 2A, the serial ring-topology memory system 20 includes a memory controller 22 having a set of output ports Sout and a set of input ports Sin, and memory devices 24, 26, 28 and 30 that are connected in series. The memory devices can be serial interface flash memory devices for example. While not shown in FIG. 2A, each memory device has a set of input ports Sin and a set of output ports Sout. These sets of input and output ports includes one or more individual input/output ports, such as physical pins or connections, interfacing the memory device to the system it is a part of. In one example, the memory devices can be flash memory devices. Alternately, the memory devices can be DRAM, SRAM, DiNOR Flash EEPROM, Serial Flash EEPROM, Ferro RAM, Magneto RAM, Phase Change RAM, or any other suitable type of memory device that has an input/output interface compatible with a specific command structure, for executing commands or for passing commands and data through to the next memory device. The current example of FIG. 2A includes four memory devices, but alternate configurations can include a single memory device, or any suitable number of memory devices. Accordingly, if memory device 24 is the first device of the system 20 as it is connected to Sout, then memory device 30 is the Nth or last device as it is connected to Sin, where N is an integer number greater than zero. Memory devices 26 to 28 are then intervening serially connected memory devices between the first and last memory devices. In the example of FIG. 2A, the memory devices 24 to 30 are synchronous and connected in series with each other and the memory controller 22.

Figure 2B:
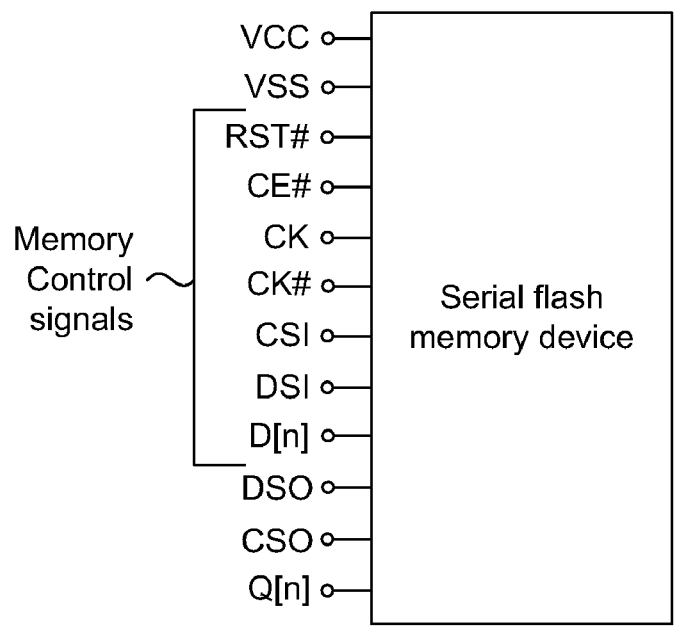
FIG. 2B is a diagram of a discrete serial interface flash memory device used in the example memory system of FIG. 2A.

FIG. 2B is a diagram of the serial interface flash memory device (24 to 30 for example) which can be used in the memory system of FIG. 2A. This example serial interface flash memory device includes power supply ports, control ports and data ports. The power supply ports include VCC and VSS for supplying power to all the circuits of the flash memory device. Additional power supply ports can be provided for supplying only the input and output buffers, as is well known in the art. Table 1 below provides an example listing of the control and data ports, their corresponding descriptions, definitions, and example logic states. It should be noted that different memory devices may have differently named control and data ports which may be functionally equivalent to those shown in Table 1, but follow protocols specific to that type of memory device. Such protocols may be governed by an established standard, or customized for a particular application. It is noted that that package pins and ball grid arrays are physical examples of a port, which is used for interconnecting signals or voltages of a packaged device to a board. The ports can include other types of connections, such as for example, terminals and contacts for embedded and system-in-package (SIP) systems.

cation No. 20090039927 entitled "Clock Mode Determination in a Memory System" filed on Feb. 15, 2008, which describes a serial memory system in which each memory device receives a parallel clock signal, and a serial memory system in which each memory device receives a source synchronous clock signal.

Having both the commonly available asynchronous flash memory devices of FIG. 1B and the serial interface flash memory devices of FIG. 2B allows a memory system manufacturer to provide both types of memory systems. However, this will likely introduce higher cost to the memory system manufacturer since two different types of memory devices must be sourced and purchased. Those skilled in the art understand that the price per memory device decreases when large quantities are purchased, hence large quantities are purchased to minimize the cost of the memory system. Therefore, while a manufacturer can provide both types of memory systems, it bears the risk of having one type of memory device fall out of market demand due the high market demand of the other. This may leave them with purchased supplies of a memory device that cannot be used.

TABLE 2

| Port | Description |
| --- | --- |
| CK/CK# | Clock: CK is the system clock input. CK and CK# are differential clock inputs. All commands, addresses, input data and output data are referenced to the crossing edges of CK and CK# in both directions. |
| CE# | Chip Enable: When CE# is LOW, the device is enabled. Once the device starts a Program or Erase operation, the Chip Enable port can be de-asserted. In addition, CE# LOW activates and CE# HIGH deactivates the internal clock signals. |
| RST# | Chip Reset: RST# provides a reset for the device. When RST# is HIGH, the device is on the normal operating mode. When RST# is LOW, the device will enter the Reset mode. |
| D[n] | Data Input: (n = 1, 2, 3, 4, 5, 6, 7 or 8) receives command, address and input data. If the device is configured in '1-bit Link mode (=default)', D1 is the only valid signal and receives one byte of packet in 8 crossings of CK/CK#. If the device is configured in '2-bit Link mode', D1 & D2 are only valid signals and receive one byte of packet in 4 crossings of CK/CK#. Unused input ports are grounded. |
| Q[n] | Data Output: (n = 1, 2, 3, 4, 5, 6, 7 or 8) transmits output data during read operation. If device is configured in '1-bit Link mode (=default)', Q1 is the only valid signal and transmits one byte of packet in 8 crossings of CK/CK#. If the device is configured in '2-bit Link mode', Q1 & Q2 are the only valid signals and transmit one byte of packet in 4 crossings of CK/CK#. Unused output ports are DNC (=Do Not Connect). |
| CSI | Command Strobe Input: When CSI is HIGH, command, address and input data through D[n] are latched on the crossing of CK and CK#. When CSI is LOW, the device ignores input signals from D[n]. |
| CSO | Command Strobe Output: The echo signal CSO is a re-transmitted version of the source signal CSI. |
| DSI | Data Strobe Input: Enables the Q[n] buffer when HIGH. When DSI is LOW, the Q[n] buffer holds the previous data accessed. |
| DSO | Data Strobe Output: The echo signal DSO is a re-transmitted version of the source signal DSI. |

With the exception of signals CSO, DSO and Q[n], all the signals noted in Table 2 are the memory control signals for operation of the example flash memory device illustrated in FIG. 2B. CSO and DSO are retransmitted versions of CSI and DSI, and Q[n] is an output for providing commands and data. The commands are received via its D[n] ports and the command signals include the control ports RST#, CE#, CK, CK#, CSI and DSI. In the example configuration shown in FIG. 2A, all signals are passed serially from the memory controller 22 to each memory device in series, with the exception of CE# and RST#, which are provided to all the memory devices in parallel. The serial interface flash memory device of FIG. 2B thus receives memory control signals having its own format or protocol, for executing memory operations therein.

Further details of the serially connected memory system of FIG. 2 are disclosed in commonly owned U.S. Patent Publi- As shown in FIG. 1B and FIG. 2B, the functional port assignments or definitions of the asynchronous and serial interface flash memory devices are substantially different from each other, and are accordingly, incompatible with each other. The functional port definitions and sequence, or timing, of sets of signals used for controlling the discrete memory devices is referred to as a protocol or format. Therefore the asynchronous and serial flash memory devices operate in response to different memory control signal formats. This means that the serial interface flash memory device of FIG. 2B cannot be used in a multi-drop memory system, and correspondingly, the asynchronous flash memory device of FIG. 1B cannot be used in a serial connected ring topology memory system.

Although serial interface flash memory devices as shown in FIG. 2A and FIG. 2B are desirable for their improved performance over the asynchronous flash memory devices of FIGS. 1A and 1B, memory system manufacturers may not wish to dispose of their supplies of asynchronous flash memory devices. Furthermore, due to their ubiquitous use in the industry, asynchronous flash memory devices are inexpensive to purchase relative to alternative flash memory devices such as the serial interface flash memory device of FIG. 2A. Presently, memory system manufacturers do not have a solution for taking advantage of the performance benefits of serially interconnected devices with minimal cost overhead.

At least some example embodiments provide a high performance composite memory device with a high-speed interface chip or a bridge device in conjunction with discrete memory devices, in a multi-chip package (MCP) or system in package (SIP). The bridge device provides an I/O interface with the system it is integrated within, and receives global memory control signals following a global format, and converts the commands into local memory control signals following a native or local format compatible with the discrete memory devices. The bridge device thereby allows for re-use of discrete memory devices, such as NAND flash devices, while providing the performance benefits afforded by the I/O interface of the bridge device. The bridge device can be embodied as a discrete logic die integrated with the discrete memory device dies in the package.

In the present examples, the global format is a serial data format compatible with the serial flash memory device of FIGS. 2A and 2B, and the local format is a parallel data format compatible with the asynchronous flash memory device of FIGS. 1A and 2B. However, the embodiments of the present invention are not limited to the above example formats, as any pair of memory control signal formats can be used based the type of discrete memory devices used in the composite memory device and the type of memory system the composite memory device is used within. For example, the global format of the memory system can follow the Open NAND Flash Interface (ONFi) standard, and the local format can follow the asynchronous flash memory device memory control signal format. For example, one specific ONFi standard is the ONFi 2.0 Specification. Alternatively, the global format can follow the asynchronous flash memory device memory control signal format and the local format can follow the ONFi 2.0 Specification format.

Figure 3A:
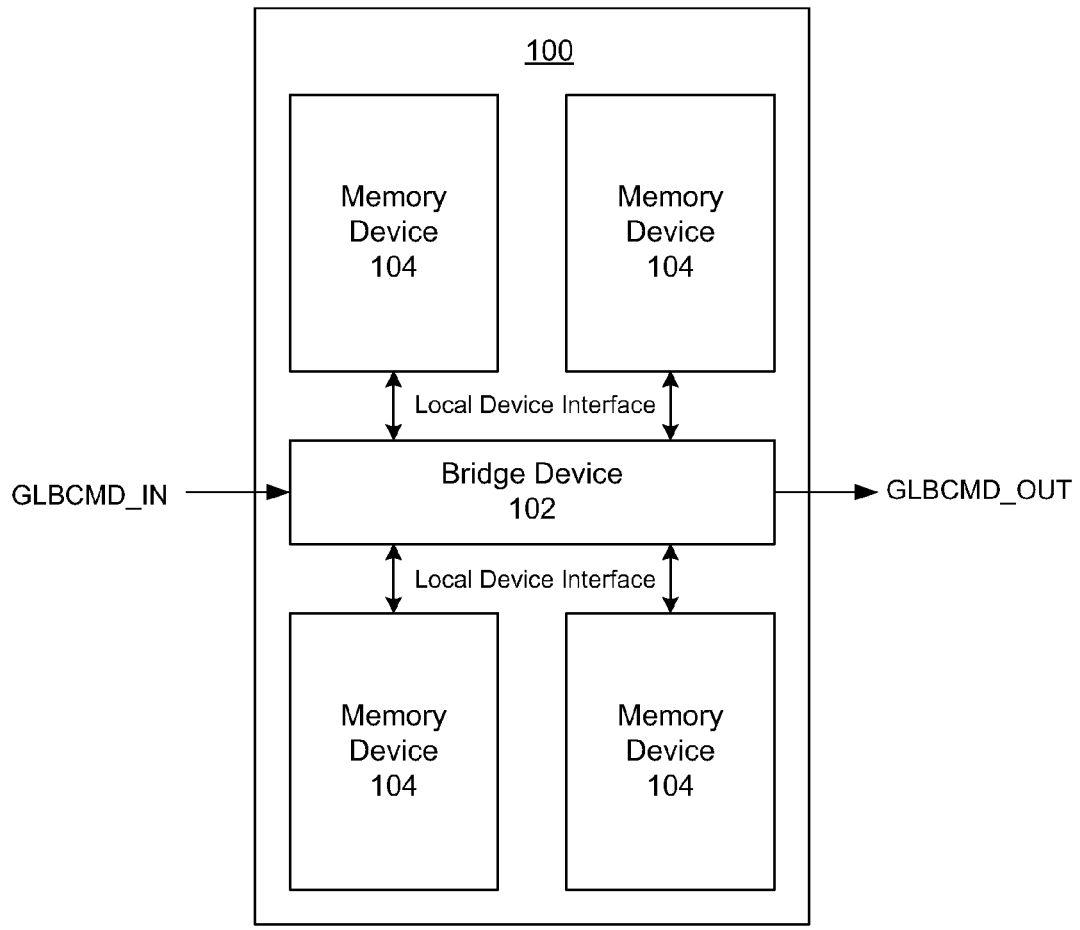
FIG. 3A is a block diagram of a composite memory device having four discrete memory devices and a bridge device in accordance with an embodiment.

FIG. 3A is a block diagram of a composite memory device, according to a present embodiment. As shown in FIG. 3A, composite memory device 100 includes a bridge device 102 connected to four discrete memory devices 104. Each of the discrete memory devices 104 can be asynchronous flash memory devices having a memory capacity of 8 Gb, for example, but any capacity discrete flash memory device can be used instead of 8 Gb devices. Furthermore, composite memory device 100 is not limited to having four discrete memory devices. Any number of discrete memory devices can be included, when bridge device 102 is designed to accommodate the maximum number of discrete memory devices in the composite memory device 100.

Figure 3B:
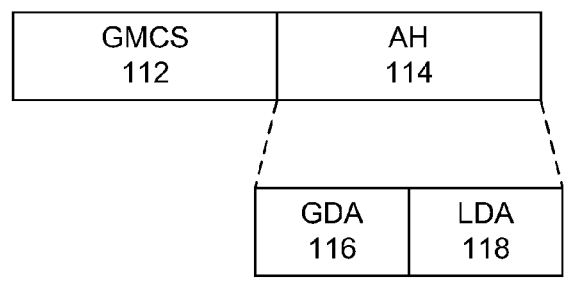
FIG. 3B is an illustration of a global command, according to a present embodiment.

Composite memory device 100 has an input port GLBCMD_IN for receiving a global command, and an output port GLBCMD_OUT for passing the received global command and read data. FIG. 3B is a schematic illustrating the hierarchy of a global command, according to a present embodiment. The global command 110 includes global memory control signals (GMCS) 112 having a specific format, and an address header (AH) 114. These global memory control signals 112 provide a memory command and command signals, such as the memory control signals for the serial interface flash memory device of FIG. 2B. The address header 114 includes addressing information used at the system level and the composite memory device level. This additional addressing information includes a global device address (GDA) 116 for selecting a composite memory device to execute an op code in the memory command, and a local device address (LDA) 118 for selecting a particular discrete device within the selected composite memory device to execute the op code. In summary, the global command includes all the memory control signals corresponding to one format, and further addressing information which may be required for selecting or controlling the composite memory device or the discrete memory devices therein.

It is noted that bridge device 102 does not execute the op code or access any memory location with the row and address information. It is, however, noted that control logic within the bridge device 102 may execute internal functions in response to the received op code. The bridge device 102 uses the global device address 116 to determine if it is selected to convert the received global memory control signals 112. If selected, bridge device 102 then uses the local device address 118 to determine which of the discrete memory devices the converted global memory control signals 112 is sent to. In order to communicate with all four discrete memory devices 104, bridge device 102 includes four sets of local I/O ports (not shown), each connected to a corresponding discrete memory device, as will be discussed later. Each set of local I/O ports includes all the signals that the discrete memory device requires for proper operation, and thereby functions as a local device interface.

Read data is provided by any one of a flash memory device 104 from composite memory device 100, or from a previous composite memory device. In particular, the bridge device 102 can be connected to a memory controller of a memory system, or to another bridge device of another composite memory device in a system of serially interconnected devices. The input port GLBCMD_IN and output port GLBCMD_OUT can be package pins, other physical conductors, or any other circuits for transmitting/receiving the global command signals and read data to and from the composite memory device 100, and in particular, to and from bridge device 102. The bridge device 102 therefore has corresponding connections to the input port GLBCMD_IN and the output port GLBCMD_OUT to enable communication with an external controller, such as memory controller 22 of FIG. 2A, or with the bridge devices from other composite memory devices in the system. As will be shown in the example embodiment of FIG. 8, many composite memory devices can be connected serially to each other.

Figure 4:
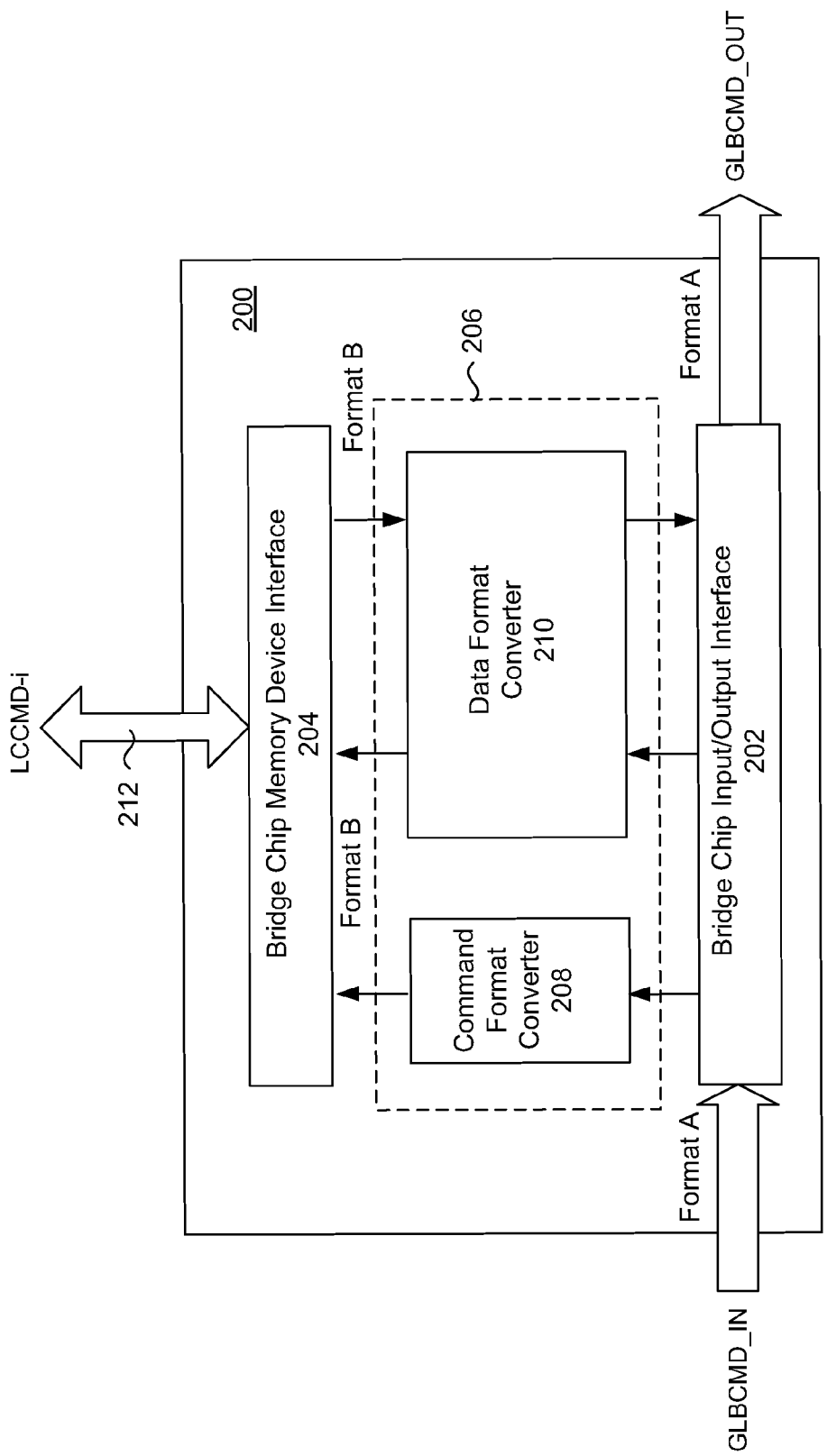
FIG. 4 is a conceptual block diagram of a bridge device in accordance with an embodiment.

FIG. 4 is a conceptual block diagram of a bridge device 200 in accordance with an embodiment, which corresponds to the bridge device 102 shown in FIG. 3A. The bridge device 200 has a bridge device input/output interface or the global input/output interface 202, a high voltage bridge chip memory device interface 204, and a format converter 206. The format converter 206 includes a command format converter 208 for converting global memory control signals, which include global commands and global command signals in a first or global format to a second or local format, and a data format converter 210 for converting data between the first (global) format and the second (local) format. The command format converter 208 further includes a state machine (not shown) for controlling the discrete memory devices, such as discrete memory devices 104 of FIG. 3A in accordance with the second format in response to the global memory control signals in the first format.

The bridge device input/output interface 202 communicates with external devices, such as for example, with a memory controller or another composite memory device. The bridge device input/output interface 202 receives global commands from a memory controller or another composite memory device in the global format, such as for example in a serial command format. With further reference to FIG. 3B, logic in the input/output interface 202 processes the global device address 116 of the global command 110 to determine if the global command 110 is addressed to the corresponding composite memory device, and processes the local device address 118 in the global command 110 to determine which of the discrete memory devices of the corresponding composite memory device is to receive the converted command, which includes an op code and optional row and column addresses and optional write data. If the global command is addressed to a discrete memory device connected to bridge device 200, the command format converter 208 in the format converter 206 converts the global memory control signals 112, which provides the op code and command signals and any row and address information from the global format to the local format, and forwards it to the memory device interface 204. If write data is provided to bridge device input/output interface 202 in a serial data format for example, then bridge device input/output interface 202 includes serial-to-parallel conversion circuitry for providing bits of data in parallel format. For read operations, bridge device input/output interface 202 includes parallel-to-serial conversion circuitry for providing bits of data in serial format for output through the GLBCMD_OUT output port.

It is assumed that the global format and the local format are known, hence logic in command format converter 208 is specifically designed to execute the logical conversion of the signals to be compatible with the discrete memory devices 104. It is noted that command format converter 208 can include control logic at least substantially similar to that of a memory controller of a memory system, which is used for controlling the discrete memory devices with memory control signals having a native format. For example, command format converter 208 may include effectively the same control logic of memory controller 14 of FIG. 1A if the discrete memory devices are asynchronous memory devices, such as memory devices 16-1 to 16-4. This means that the control logic in command format converter 208 provides the timing and sequencing of the memory control signals in the local format native to the discrete memory devices.

If the global command corresponds to a data write operation, the data format converter 210 in the format converter 206 converts the data from the global format to the local format, and forwards it to the memory device interface 204. The bits of read or write data do not require logical conversion, hence data format converter 210 ensures proper mapping of the bit positions of the data between the first data format and the second data format. Format converter 206 functions as a data buffer for storing read data from the discrete memory devices or write data received from the bridge device input/output interface 202. Therefore, data width mismatches between the global format and the local format can be accommodated. Furthermore, different data transmission rates between the discrete memory devices and the bridge device 200, and the bridge device 200 and other composite memory devices are accommodated due to the buffering functionality of data format converter 210.

The memory device interface 204 then forwards or communicates the converted command in the local command format to the discrete memory device selected by the local device address 118 in the global command 110 of FIG. 3B. In the present embodiment, the converted command is provided via a command path 212. In an embodiment, command path 212 includes i sets of dedicated local I/O ports LCCMD-i, or channels, connected between each discrete memory device in the composite memory device and the memory device interface 204. The variable i is an integer number corresponding to the number of discrete memory devices in the composite memory device. For example, each LCCMD-i channel includes all the ports shown in FIG. 1B and Table 1.

Figure 5:
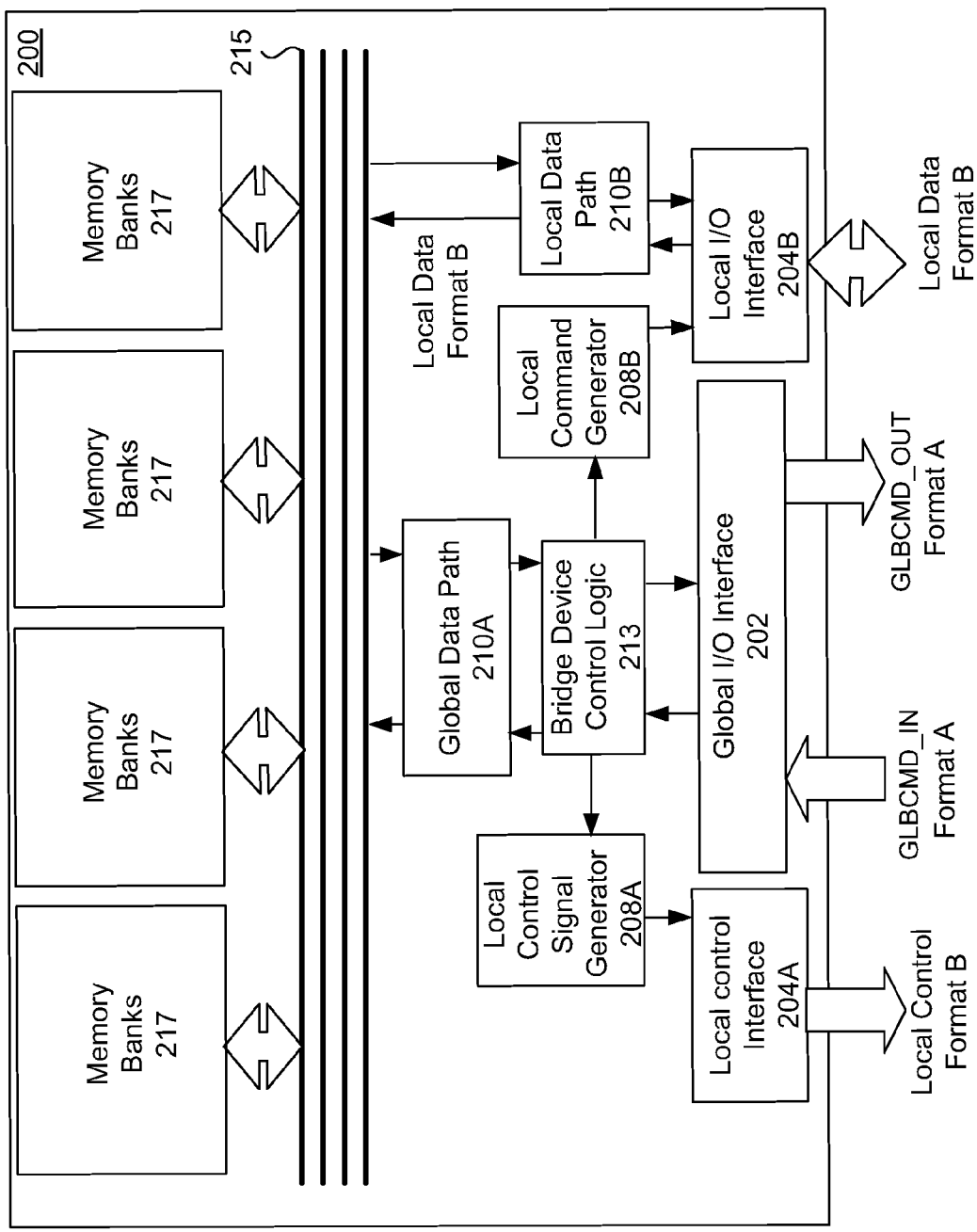
FIG. 5 is a more detailed block diagram of bridge device architecture in accordance with an embodiment.

FIG. 5 is a more detailed block diagram of bridge device layout architecture of the bridge device 200 in accordance with an embodiment. The bridge device 200 has a global input/output interface 202, a local control interface 204A, a high voltage input/output port 204B. The global input/output interface 202 is interposed between the local control interface and the local input/output interface. This arrangement enables the pin configuration of the composite device to be optimized by minimizing wire length and minimizing crossover of wires leading to reliability in the interconnections, reduced wire inductance and better packaging efficiencies. The global input/output interface 202 is connected to a bridge device control logic 213 for communicating global memory control signals and data between the at least one discrete memory device and an external controller or another bridge device.

The command format converter 208 of FIG. 4 is shown as in FIG. 5 as local control signal generator 208A and local command generator 208B. The bridge device control logic 213 provides the global memory control signals to the local control signal generator 208A for converting the global memory control signals in the global format to the local format. The local control interface 204A receives the converted control signals and controls the discrete memory devices. The bridge device control logic 213 provides the global memory command signals to the local command generator 208B for converting the global memory command signals in the global format to the local format. The local input/output interface 204B receives the converted command signals and provides the commands to the discrete memory devices for execution in the discrete memory devices.

The data format converter 210 of FIG. 4 is shown, in part, as in FIG. 5 as global data path logic 210A and local data path logic 210B. The N-bit data channel 215 and memory banks 217 together with the global data path logic 210A and local data path logic 210B form the data format converter 210 of FIG. 4. The bridge device control logic 213 provides write data in the global format to the global data path logic 210A, which then converts the write data to the local format. The converted write data is written onto the memory banks 217 through the N-bit data channel 215. The write data temporarily stored in the memory banks 217, which act as a virtual page buffer. The write data is then provided to the local data path logic 210B and transferred onto the discrete memory devices via the local input/output interface 204B. The timing for data transfer between the global input/output interface and the memory banks is controlled by the global data path logic 210A. Data format conversion between the global format and the local format can include a change in the data transfer rate between the global format and the local format.

Similarly, read data, in the local format, from the discrete memory devices is read onto the memory banks 217 via the local input/output interface 204A and the local data path logic 210B. The read data temporarily stored in the memory banks 217 is converted into the global format by the global data path logic 210A and provided to the global input/output interface 202 via the bridge device control logic 214. The timing for data transfer between the memory banks and the discrete memory devices is controlled by the local data path logic 210B.

It is noted that the local control interface 204A and the local input/output interface 204B include output drivers that receive high voltage supply, for example 3.3 volts. Furthermore, the local input/output interface 204B includes input buffers that are powered by high voltage. In addition, the local control interface 204A and the local input/output interface 204B may include voltage converters to up-convert or down-convert core logic voltage to the high voltage as required by the local interfaces. The global input/output interface 202 includes input buffers and output drivers powered by a low voltage supply, for example, 1.5 volts. All the interfaces can use the same ground voltage supply.

Following is a description of example operations of bridge device 200 shown in FIG. 5, with further reference to the composite memory device 100 of FIG. 3A. For a read operation, a global command, such as a global read command arrives at the bridge device input/output interface 202 through input port GLBCMD_IN. This global read command includes the global memory control and command signals that provide an op code and row and column information, in the global format, for data to be read out from a discrete memory device 104 connected to the bridge device 200. Once the bridge device input/output interface 202 determines that it has been selected for the global read command by comparing the global device address 116 to a predetermined address of the composite memory device 100, the command format converter 208 converts the global read command into the local format compatible with the discrete memory device 104 on which the read data command is to be executed. As will be described later, the composite memory device can have an assigned address. The local device address 118 of the global read command is forwarded to the memory device interface 204, and the converted read data command is provided to the discrete memory device addressed by the local device address via a corresponding set of local I/O ports of the command path 212.

Data referred to as read data, is read from the selected discrete memory device 104 and provided to the data format converter 210 via the same local I/O interface 204B in the local format. The data format converter 210 then converts the read data from the local format to the global format and provides the read data from the selected discrete memory device 104 to the memory controller through output port GLBCMD_OUT of global input/output interface 202. Bridge device interface 202 includes internal switching circuitry for coupling either the read data from data format converter 210 or the input port GLBCMD_IN to the output port GLBCMD_OUT. The proximal placement of the bridge device control logic 213 with respect to the global input/output interface minimizes delay times for global memory control signals not addressed to that particular composite device and efficiently transfers the global memory control signals onto the next composite device.

Figure 6A:
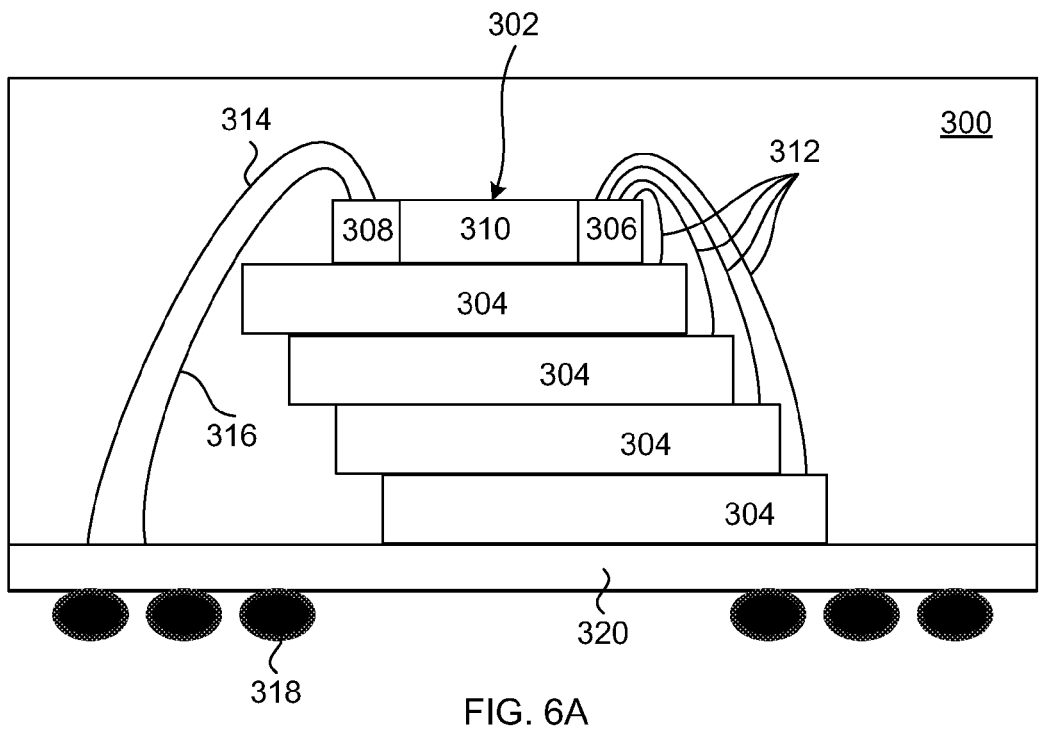
FIGS. 6A and 6B are schematic cross-sections of a composite memory device in a package in accordance with another embodiment.
Figure 6B:
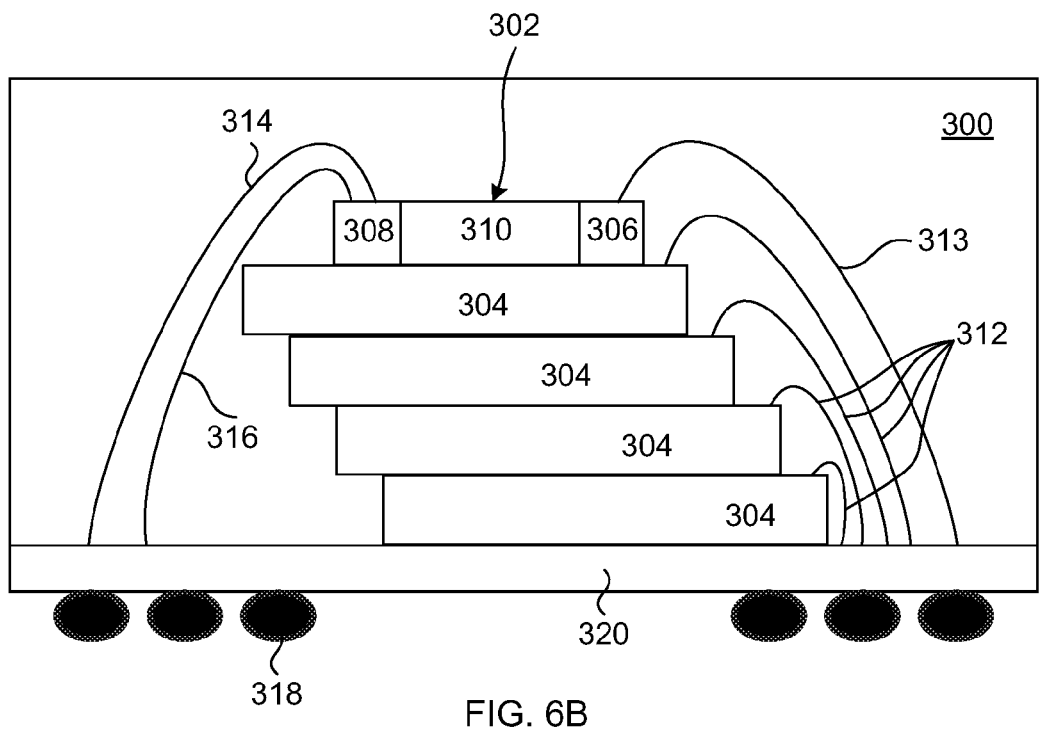

FIG. 3A described above is a functional representation of a composite memory device, according to one embodiment. FIG. 6 shows a composite memory device manufactured as a system in package (SIP), which corresponds to the composite memory device shown in FIG. 3A, according to another embodiment. FIGS. 6A and 6B show schematic cross-sections of a composite memory device stacked in a package. The package 300 includes bridge device 302 corresponding to bridge device 102 of FIG. 3A, and four discrete memory devices 304 corresponding respectively to discrete memory devices 104 also from FIG. 3A. In the present embodiment, these devices are fabricated semiconductor chips, or dies. The bridge device 302 communicates with memory devices 304 via bridge chip memory device interface 306 in a local format such as the parallel asynchronous NAND format for example. The bridge device 302 communicates with a memory controller (not shown) or with another composite memory devices' bridge device via the bridge device input/output interface 308 in a global format, such as for example, the previously described serial data format. The format converter 310 includes the previously mentioned command format converter 208 and data format converter 210 of FIG. 3A, for providing uni-directional command format conversion and bi-directional data format conversion between itself and the discrete memory devices 304.

In the presently shown example of FIG. 6A, the composite memory device package 300 is referred to as an SIP system, or a multi-chip package (MCP) system. The package encapsulates bridge device 302 and all four discrete memory devices 304. Local communication terminals, represented by wires 312, connect the ports of each discrete memory device 304 to the memory device interface 306 of bridge device 302. Each wire 312 represents one channel LCCMD-i carrying all the signals corresponding to the local format. One example local format is the asynchronous flash memory format including the signals shown in Table 1. Global communication terminals, represented by groups of wires 314 and 316 connect input port GLBCMD_IN and output port GLBCMD_OUT respectively, to package leads 318 via optional package substrate 320. The physical arrangement of bridge device 302 and discrete memory devices 304 relative to each other depends on the position of the bond pads of discrete memory devices 304 and the position of the bond pads of the bridge device 302.

In the example shown in FIG. 6B, the local communication terminals, represented by wires 312, connect the ports of each discrete memory device 304 to the substrate 320. Wires 313 then connect the substrate 320 to bridge chip memory device interface 306 of bridge device 302. Wiring tracks in substrate 320 connect wires 312 to wires 313. This arrangement can ensure that the communication terminals 312 between each discrete memory device 304 and the bridge chip memory device interface 306 are of equal length. Substrate conductor tracks can be adjusted to ensure that the total conductor length between the discrete memory devices and the bridge device are substantially equal. Equal conductor length ensure uniformity in the amount of parasitic inductance and capacitance across the entire package.

In the presently shown example in FIGS. 6A and 6B, the discrete memory devices 304 are placed with their bond pads facing in the upwards direction and stacked upon each other with appropriate spacers (not shown) in a staggered step pattern for exposure so as not to obstruct the bond pads of the devices which are located proximate to an edge of the chip. Bridge device 302 is placed with its bond pads facing in the upwards direction, and is stacked on the upper-most discrete memory device 304 of the stack. Other configurations are possible, depending on the placement of the discrete memory device bond pads (for example, see FIGS. 7 and 8), and different communication terminals can be used instead of bond wires. For example, wireless communication via inductive coupling technology can be used, or through silicon via (TSV) interconnection can be used instead of bond wires. Commonly owned U.S. Patent Publication No. 20090161402 entitled "Data Storage and Stackable Configurations" and U.S. Patent Publication No. 20090020855 entitled "Method for Stacking Serially-Connected Integrated Circuits and Multi-Chip Device Made from Same" show techniques for stacking chips together, the contents of which are hereby incorporated by reference in their entirety. Also, bridge device 302 does not contribute significantly to the size of the stack in the package 300. Accordingly, it should be clear to persons skilled in the art that composite memory device 300 occupies minimal area in a larger system, while providing high storage capacity.

Figure 7A:
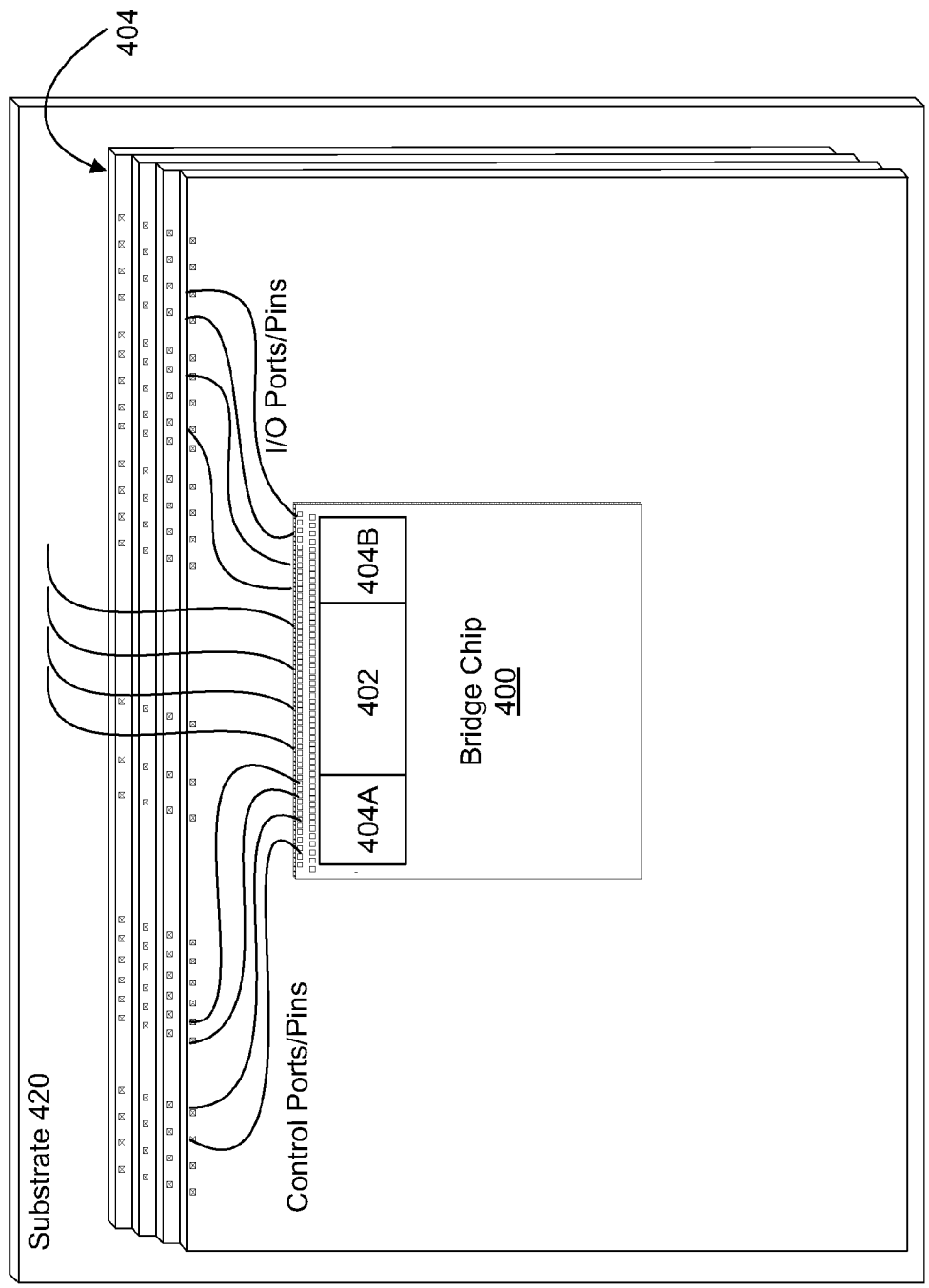
FIGS. 7A and 7B are schematic representations of die-to-die bonding of a composite memory device in a package in accordance with another embodiment.
Figure 7B:
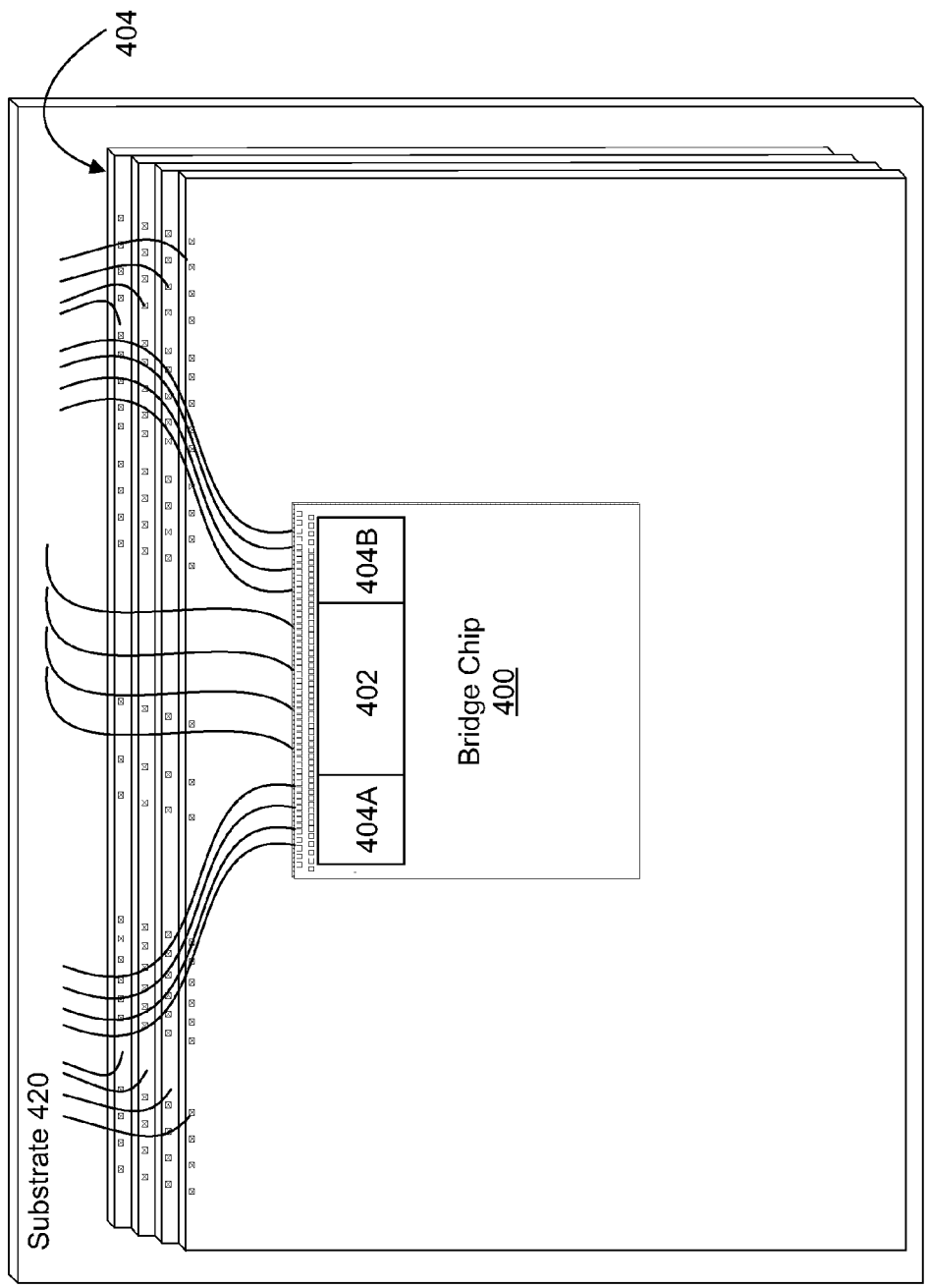

FIGS. 7A and 7B are an illustration of multi-chip package die-to-die bonding. The wiring shown in FIGS. 7A and 7B are not intended to represent the wiring of all ports/pads, but generally shows how actual wiring between the devices would be achieved. As discussed previously, the bridge chip 400 is stacked on top of the four discrete memory devices 404 on a substrate 420. The four discrete memory devices are stacked in an offset arrangement to expose the connection pins or ports of each of the discrete memory devices. In this example, the connection ports of all the discrete memory devices and the bridge chip are arranged to be along the same side for ease of bonding through the substrate. The global input/output interface 402 is advantageously located or interposed between the local control interface 402A and the local input/output interface 402B. In the example embodiment of FIG. 7A, wiring from the global input/output interface 402 to the substrate 420 and wiring from the local control interface 404A and the local input/output interface 404B to one of the discrete memory device 404 is shown. In addition, in the example shown in FIG. 7A, the control pins/ports and I/O ports/pins of the discrete memory devices 404 are grouped and arranged on either side of the discrete memory devices 404 for ease of connection with the local control interface 402A and the local input/output interface 402B. As described earlier, this arrangement enables the pin configuration of the package to be optimized by minimizing wire length and minimizing cross-over of wires leading to reliability in the interconnections, reduced wire inductance and better packaging efficiencies.

In the example shown in FIG. 7B, the local communication terminals connecting the ports of each discrete memory device 404 to the local control interface 404A and the local input/output interface 404B of bridge device 400 are routed through the substrate 420. In both examples, Solder bumps, connected to pads of the substrate 420, are provided on the opposing (bottom) side of the substrate 420 to send and receive global control and data signals.

Figure 8:
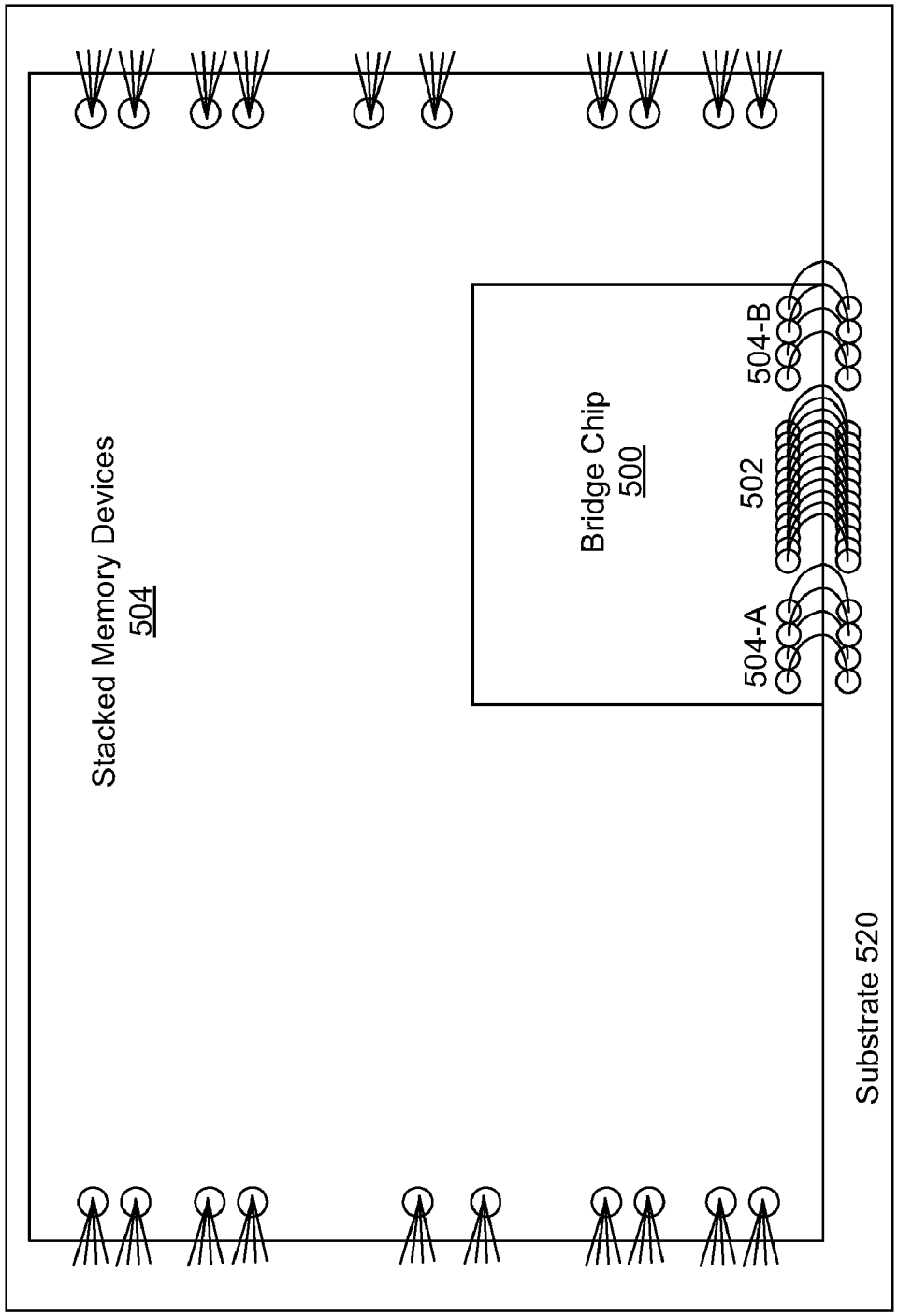
FIG. 8 is a schematic representation of wire bonding of a composite memory device in a package in accordance with another embodiment; and, FIG. 9 is a block diagram of a memory system having a number of composite memory devices connected to a controller in a serial interconnected memory system in accordance with an embodiment.

FIG. 8 is an illustration of multi-chip package wire bonding. In this example architecture, the bridge chip 500 is stacked on top of the four discrete memory devices 504 on a substrate 520. In this example, however, the connection pins of all the discrete memory devices are placed on opposing sides on the discrete memory devices. In addition, the four discrete memory devices are stacked without any offset, with spacers between the individual devices. The connection pins or ports of the bridge chip 500 are along an orthogonal side relative to the connection pins of all the discrete memory devices as shown in FIG. 8. Once again, the global input/output interface 502 is advantageously located between the local control interface 502-A and the local input/output interface 502-B. The connections between the local control interface 502-A, the local input/output interface 502-B, and the discrete memory devices can be achieved through the substrate 520.

It is noted that FIGS. 7 and 8 are only two possible examples for the actual realization of the multi-chip package, and several other arrangements are possible.

Figure 9:
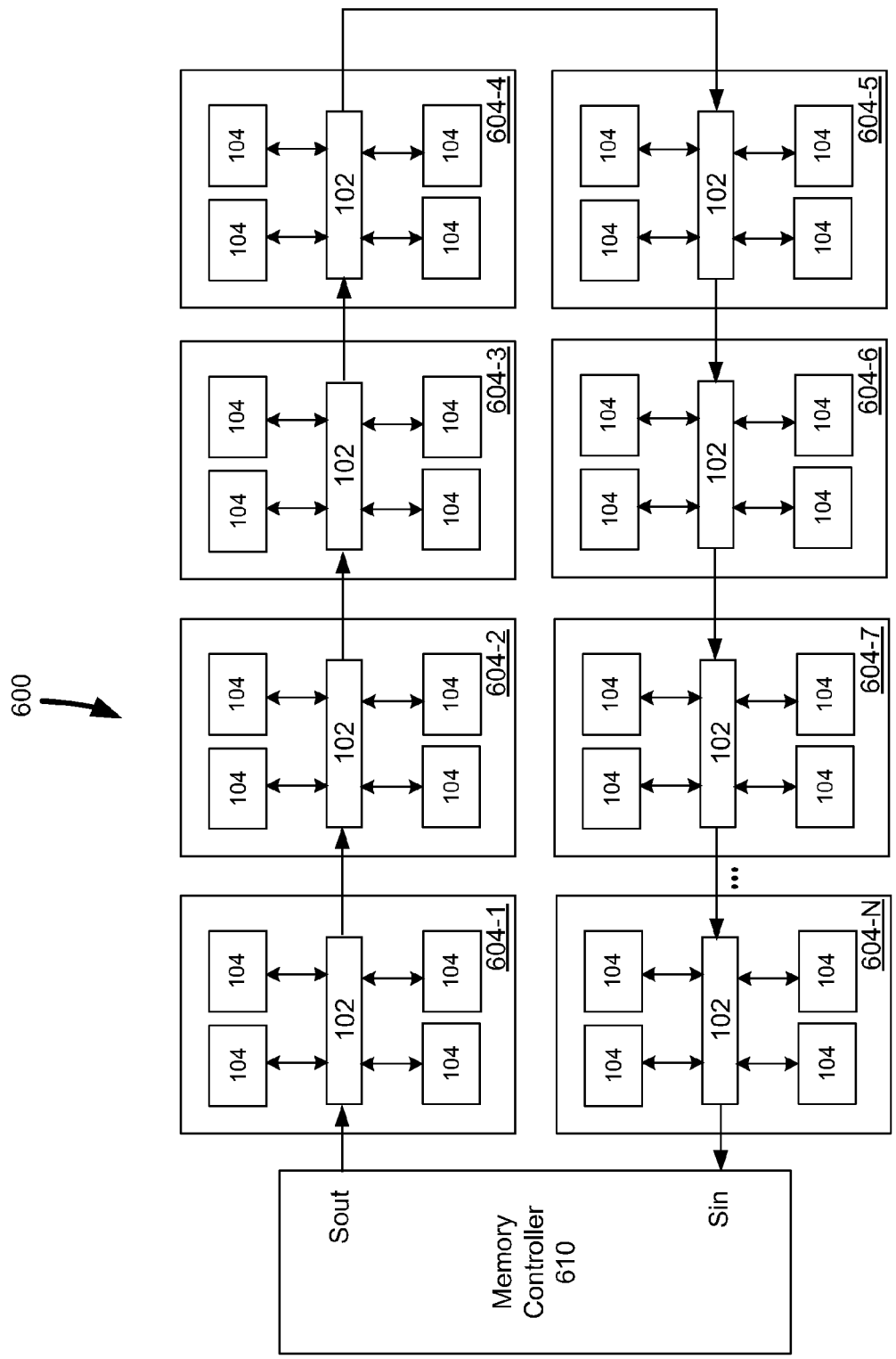

The composite memory device embodiments of FIGS. 6-8 can be used in a memory system, such as the serial memory system of FIG. 2A, according to another embodiment. Hence, the memory system 600 of FIG. 9 is similar to the serial memory system 20 of FIG. 2A. Memory system 600 includes a memory controller 610 and composite memory devices 604-1 to 604-N, where N is an integer number. The individual composite memory devices 604-1-604-N are serially interconnected with the memory controller 610. Similar to system 20 of FIG. 2A, composite memory device 604-1 is the first composite memory device of memory system 600 as it is connected to an output port Sout of memory controller 602, and memory device 604-N is the last device as it is connected to an input port Sin of memory controller 610. Composite memory devices 504-2 to 504-7 (or 504-(N−1) to be precise) are then intervening serially connected memory devices connected between the first and last composite memory devices. The Sout port provides a global command in a global format. The Sin port receives read data in the global format, and the global command as it propagates through all the composite memory devices.

Each of the composite memory devices shown in FIG. 9 is similar to the composite memory device 100 shown in FIG. 3A. Each of the composite memory devices has a bridge device 102 and four discrete memory devices 104. As was previously described, each bridge device 102 in each of the composite memory device is connected to respective discrete memory devices 104, and to either the memory controller 610 and/or a previous or subsequent composite memory device in the serial-ring topology or serial interconnection configuration. The function of each composite memory device 504-1 to 504-N is the same as previously described for the embodiments of FIG. 3A and FIG. 4.

In memory system 600, each composite memory device is assigned a unique global device address. This unique global device address can be stored in a device address register of the bridge device 102, and more specifically in a register of the bridge device control logic 213 of the bridge device as shown in the block diagram shown in FIG. 5. This address can be assigned automatically during a power up phase of memory system 600 using a device address assignment scheme, as described in commonly owned U.S. Patent Publication No. 20080192649 entitled "Apparatus and Method for Producing Identifiers Regardless of Mixed Device Type in a Serial Interconnection". Furthermore, each composite memory device 604 can include a discrete device register for storing information about the number of discrete memory devices in each composite memory device 604. Thus during the same power up phase of operation, the memory controller can query each discrete device register and record the number of discrete memory devices within each composite memory device. Hence the memory controller can selectively address individual discrete memory devices 104 in each composite memory device 604 of memory system 600.

A description of the operation of memory system 600 follows, using an example where composite memory device 604-3 is to be selected for executing a memory operation. In the present example, memory system 600 is a serially connected memory system similar to the system shown in FIG. 2, and each of the discrete memory devices 104 are assumed to be asynchronous NAND flash memory devices. Therefore the bridge devices 102 in each of the composite memory devices 604-1 to 604-N are designed for receiving global commands in a global format issued by memory controller 610, and converting them into a local format compatible with the NAND flash memory devices. It is further assumed that memory system has powered up and addresses for each composite memory device have been assigned.

The memory controller 610 issues a global command from its Sout port, which includes a global device address 116 corresponding to composite memory device 604-3. The first composite memory device 604-1 receives the global command, and its bridge device 102 compares its assigned global device address to that in the global command. Because the global device addresses mismatch, bridge device 102 for composite memory device 604-1 ignores the global command and passes the global command to the input port of composite memory device 604-2. The same action occurs in composite memory device 604-2 since its assigned global device address mismatches the one in the global command. Accordingly, the global command is passed to composite memory device 604-3.

Due to the internal architecture of the bride device, the address matching and determination is performed proximal to the low voltage input/output port (for example, in the bridge device control logic 213 proximal to the low voltage input/output port 202 as shown in FIG. 5). This arrangement advantageously minimizes the time delay for the propagation of the global command through the non-selected composite memory devices and thus, optimizes the overall performance of the memory system 600.

The bridge device 102 of composite memory device 604-3 determines a match between its assigned global device address and the one in the global command. Therefore, bridge device 102 of composite memory device 604-3 proceeds to convert the global memory control signals into the local format compatible with the NAND flash memory devices. The bridge device then sends the converted command to the NAND flash memory device selected by the local device address 118, which is included in the global command.

The selected NAND flash device then executes the operation corresponding to the local memory control signals it has received.

While bridge device 102 of composite memory device 604-3 is converting the global command, it passes the global command to the next composite memory device. The remaining composite memory devices ignore the global command, which is eventually received at the Sin port of memory controller 610. If the global command corresponds to a read operation, the selected NAND flash memory device of composite memory device 604-3 provides read data to the virtual page buffer (for example, virtual page buffer 217 as shown in FIG. 5) of its corresponding bridge device 102 in the local format. The data format converter in the bridge device 102 then converts the read data into the global format, and passes it through its low voltage input/output port to the next composite memory device. The bridge devices 102 of all the remaining composite memory devices pass the read data to the Sin port of memory controller 610. Those skilled in the art should understand that other global commands may be issued for executing the read operation, all of which are converted by the bridge device 102 of selected composite memory device 604.

In the present embodiment, the global command is propagated to all the composite memory devices in memory system 600. According to an alternate embodiment, the bridge devices 102 include additional logic for inhibiting the global command from propagating to further composite memory devices in the memory system 600. More specifically, once the selected composite memory device determines that the global device is addressed to it, its corresponding bridge device 102 drives its output ports to a null value, such as a fixed voltage level of VSS or VDD for example. Therefore, the remaining unselected composite memory devices conserve switching power since they would not execute the global command. Details of such a power saving scheme for a serially connected memory system are described in commonly owned U.S. Patent Publication No. 20080201588 entitled "Apparatus and Method for Producing Identifiers Regardless of Mixed Device Type in a Serial Interconnection", the contents of which are incorporated by reference in their entirety.

The previously described embodiment of FIG. 9 illustrates a memory system where each composite memory device 604-1 to 604-N having the same type of discrete memory devices therein, such as for example asynchronous NAND flash memory devices. This is referred to as a homogeneous memory system because all the composite memory devices are the same. In alternate embodiments, a heterogeneous memory system is possible, where different composite memory devices have different types of discrete memory devices. For example, some composite memory devices include asynchronous NAND flash memory devices while others can include NOR flash memory devices. In such an alternate embodiment, all the composite memory devices follow the same global format, but internally, each composite memory device has its bridge device 200, as shown in FIG. 4, designed to convert the global format memory control signals to the local format memory control signals corresponding to the NOR flash memory devices or NAND flash memory devices.

In yet other embodiments, a single composite memory device could have different types of discrete memory devices. For example, a single composite memory device could include two asynchronous NAND flash memory devices and two NOR flash memory devices. This "mixed" or "heterogeneous" composite memory device can follow the same global format described earlier, but internally, its bridge device can be designed to convert the global format memory control signals to the local format memory control signals corresponding to the NAND flash memory devices and the NOR flash memory devices.

Such a bridge device can include one dedicated format converter for each of the NAND flash memory device and the NOR flash memory device, which can be selected by previously described address information provided in the global command. As described with respect to FIG. 3B, the address header 114 includes addressing information used at the system level and the composite memory device level. This additional addressing information includes a global device address (GDA) 116 for selecting a composite memory device to execute an op code in the memory command, and a local device address (LDA) 118 for selecting a particular discrete device within the selected composite memory device to execute the op code. The bridge device can have a selector that uses LDA 118 to determine which of the two format converters the global command should be routed to.

The previously described embodiments of the composite memory device show how discrete memory devices responsive to memory control signals of one format can be controlled using global memory control signals having a second and different format. According to an alternate embodiment, the bridge device 200 can be designed to receive global memory control signals having one format, for providing local memory control signals having the same format to the discrete memory devices. In other words, such a composite memory device is configured to receive memory control signals that are used to control the discrete memory devices. Such a configuration allows multiple discrete memory devices to each function as a memory bank operating independently of the other discrete memory device in the composite memory device. Therefore, each discrete memory device can receive its commands from the bridge device 200, and proceed to execute operations substantially in parallel with each other. This is also referred to as concurrent operations. The design of bridge device 200 is therefore simplified, as no command conversion circuitry is required.

The previously described embodiments illustrate how discrete memory devices in a composite memory device can respond to a foreign command format. This is achieved through the bridge device that converts the received global command into a native command format compatible with the discrete memory devices. By example, a serial command format can be converted into an asynchronous NAND flash format. The embodiments are not limited to these two formats, as any pair of command formats can be converted from one to the other.

In the preceding description, for purposes of explanation, numerous details are set forth in order to provide a thorough understanding of example embodiments. However, it will be apparent to one skilled in the art that these specific details are not required in order to practice the invention. In other instances, well-known electrical structures and circuits are shown in block diagram form in order not to obscure example embodiments.

It will be understood that when an element is herein referred to as being "connected" or "coupled" to another element, it can be directly connected or coupled to the other element or intervening elements may be present. In contrast, when an element is herein referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Figures in this application are not necessarily to scale. For example, in FIG. 6 the relative sizes of the bridge device 302 and discrete memory devices 304 are not to scale, and a fabricated bridge device is orders of magnitude smaller in area than the discrete memory devices 304.

Certain adaptations and modifications of the described embodiments can be made. Therefore, the above-discussed embodiments are considered to be illustrative and not restrictive.

What is claimed is:

1. A composite memory device, comprising:
   a substrate including global leads and conductive tracks;
   at least one discrete memory device configured to communicate local signals between the at least one discrete memory device and the conductive tracks;
   a bridge device having
      a local interface configured to communicate the local signals between the conductive tracks and the bridge device, and
      a global interface configured to communicate global signals between the global leads and the bridge device.

2. The composite memory device of claim 1, wherein the bridge device includes a format converter for converting the global signals having a first format to the local signals having a second format.

3. The composite memory device of claim 1, wherein the at least one discrete memory device is seated on the substrate.

4. The composite memory device of claim 3, wherein the bridge device is seated on the at least one discrete memory device.

5. The composite memory device of claim 3, wherein the at least one discrete memory device includes a first discrete memory device seated on the substrate and a second discrete memory device seated on the first discrete memory device.

6. The composite memory device of claim 5, wherein the bridge device is seated on the second discrete memory device.

7. The composite memory device of claim 6, wherein the local interface includes a first local interface and a second local interface, and the conductive tracks include first conductive tracks and second conductive tracks.

8. The composite memory device of claim 7, wherein the first local interface communicates first local signals with the first conductive tracks, and the second local interface communicates second local signals with the second conductive tracks.

9. The composite memory device of claim 6, wherein the global interface of the bridge device is electrically connected to the global leads with wires.

10. The composite memory device of claim 8, wherein the first local interface is electrically connected to the first conductive tracks with first wires and the second local interface is electrically connected to the second conductive tracks with second wires.

11. The composite memory device of claim 10, wherein the first discrete memory device is electrically connected to the first conductive tracks with third wires and the second discrete memory device is connected to the second conductive tracks with fourth wires.

12. The composite memory device of claim 10, wherein a sum of the length of the first conductive tracks, the first wires and the third wires is approximately the same as a sum of the length of the second conductive tracks, the second wires and the fourth wires.

13. The composite memory device of claim 1, wherein the local interface of the bridge device includes
   a first local interface configured to communicate a first portion of the local signals between the bridge device and the discrete memory device, and,
   a second local interface configured to communicate a second portion of the local signals between the bridge device and the discrete memory device.

14. The composite memory device of claim 13, wherein the global interface of the bridge device is interposed between the first local interface and the second local interface.

15. The composite memory device of claim 14, wherein the first local interface and the second local interface are electrically connected to the conductive tracks of the substrate with wires.

16. The composite memory device of claim 15, wherein the at least one discrete memory device is electrically connected to the conductive tracks of the substrate with wires.

17. The composite memory device of claim 16, wherein the global interface of the bridge device is electrically connected to the global leads with wires.

18. The composite memory device of claim 1, wherein connection pads of the at least one discrete memory device and the bridge device are aligned along the same side with respect to each other.

19. The composite memory device of claim 1, wherein connection pads of the at least one discrete memory device and the bridge device are aligned along orthogonal sides with respect to each other.

* * * * *